(12) United States Patent
Maejima et al.

(10) Patent No.: US 8,345,466 B2
(45) Date of Patent: Jan. 1, 2013

(54) NONVOLATILE SEMICONDUCTOR MEMORY DEVICE ADJUSTING VOLTAGE OF LINES IN A MEMORY CELL ARRAY

(75) Inventors: Hiroshi Maejima, Chuo-ku (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 12/849,407

(22) Filed: Aug. 3, 2010

(65) Prior Publication Data

US 2011/0032746 A1 Feb. 10, 2011

(30) Foreign Application Priority Data

Aug. 6, 2009 (JP) .................................. 2009-183732
Dec. 7, 2009 (JP) .................................. 2009-277170

(51) Int. Cl.
*G11C 11/00* (2006.01)
(52) U.S. Cl. .... 365/148; 365/145; 365/163; 365/230.06
(58) Field of Classification Search .............. 365/145 X, 365/148 X, 163 X, 230.06 X, 145, 148, 163, 365/189.06, 230.06
See application file for complete search history.

(56) References Cited

U.S. PATENT DOCUMENTS 7,885,091 B2 * 2/2011 Mihnea et al. ................ 365/148
2010/0103714 A1 4/2010 Maejima

FOREIGN PATENT DOCUMENTS

JP 2005-522045 7/2005
JP 2006-344349 12/2006

OTHER PUBLICATIONS

U.S. Appl. No. 13/233,738, filed Sep. 15, 2011, Hosono.

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A nonvolatile semiconductor memory device according to an embodiment includes a memory cell array including: a plurality of first lines; a plurality of second lines intersecting the first lines; and a plurality of memory cells each including a variable resistance element disposed at the intersection of the first and second lines and configured to store an electrically rewritable resistance value as data in a nonvolatile manner, and a control unit configured to detect an amount of a current flowing through the first line when a memory cell is accessed, and adjust the voltage of the first or second line based on the amount of the current.

20 Claims, 19 Drawing Sheets

| ADD | | OUT | | | SW | | | | | | | | | |
|---|---|---|---|---|---|---|---|---|---|---|---|---|---|---|
| 10 | 9 | 3 | 2 | 1 | 1 | 2 | 3 | 4 | 5 | 6 | 7 | 8 | 9 | 10 |
| 0 | 0 | 0 | 0 | 0 | 1 | | | | | | | | | |
| 0 | 0 | 0 | 0 | 1 | 1 | | | | | | | | | |
| 0 | 0 | 0 | 1 | 1 | 1 | | | | | | | | | |
| 0 | 0 | 1 | 1 | 1 | 1 | | | | | | | | | |
| 0 | 1 | 0 | 0 | 0 | 1 | | | | | | | | | |
| 0 | 1 | 0 | 0 | 1 | | 1 | | | | | | | | |
| 0 | 1 | 0 | 1 | 1 | | | 1 | | | | | | | |
| 0 | 1 | 1 | 1 | 1 | | | | 1 | | | | | | |
| 1 | 0 | 0 | 0 | 0 | 1 | | | | | | | | | |
| 1 | 0 | 0 | 0 | 1 | | | 1 | | | | | | | |
| 1 | 0 | 0 | 1 | 1 | | | | | 1 | | | | | |
| 1 | 0 | 1 | 1 | 1 | | | | | | | 1 | | | |
| 1 | 1 | 0 | 0 | 0 | 1 | | | | | | | | | |
| 1 | 1 | 0 | 0 | 1 | | | | 1 | | | | | | |
| 1 | 1 | 0 | 1 | 1 | | | | | | | | 1 | | |
| 1 | 1 | 1 | 1 | 1 | | | | | | | | | | 1 |

# NONVOLATILE SEMICONDUCTOR MEMORY DEVICE ADJUSTING VOLTAGE OF LINES IN A MEMORY CELL ARRAY

CROSS REFERENCE TO RELATED APPLICATIONS

This application is based on and claims the benefit of priority from prior Japanese Patent Application No. 2009-183732, filed on Aug. 6, 2009, and Japanese Patent Application No. 2009-277170, filed on Dec. 7, 2009, the entire contents of which are incorporated herein by reference.

BACKGROUND

1. Field

Embodiments described herein relate generally to a nonvolatile semiconductor memory device.

2. Description of the Related Art

Conventionally, as an electrically rewritable nonvolatile memory, a flash memory is known which includes a cell array configured by NAND connection or NOR connection of memory cells each having a floating gate structure. Further, a ferroelectric memory is also known as a memory that is nonvolatile and compatible with fast random access.

Meanwhile, as a technique for enabling greater miniaturization of memory cells, a resistance varying memory using a variable resistance element in each memory cell is proposed. Known variable resistance elements include: a phase change memory element varying a resistance by phase changes of a chalcogenide compound between a crystallized state and an amorphous state; an MRAM element using resistance changes due to tunnel magnetoresistance effect; a memory element of a polymer ferroelectric RAM (PFRAM) including a resistance element made of a conductive polymer; a ReRAM element inducing resistance changes upon electric pulse application, etc (Patent Document 1: JP 2006-344349A, paragraph 0021).

In the resistance varying memory, memory cells can be configured by a series circuit of not a transistor but a Schottky diode and a variable resistance element. Therefore, memory cells can be easily stacked to a three-dimensional structure and hence are advantageous for grater miniaturization (Patent Document 2: JP 2005-522045A).

However, a relatively large current flows through this resistance varying memory and its interconnection lines in a reset operation of changing the resistance state of the variable resistance element from a low resistance state to a high resistance state and in a read operation of sensing the resistance state of the variable resistance element. Therefore, influence of a voltage drop due to an interconnection resistance is unignorable. That is, since the influence of a voltage drop varies depending on the location to be accessed, a read margin and a reset margin are reduced. Furthermore, there is also a problem that the number of bits that can be accessed simultaneously is limited.

DETAILED DESCRIPTION

A nonvolatile semiconductor memory device according to an embodiment includes a memory cell array including: a plurality of first lines; a plurality of second lines intersecting the first lines; and a plurality of memory cells each including a variable resistance element disposed at the intersection of the first and second lines and configured to store an electrically rewritable resistance value as data in a nonvolatile manner, and a control unit configured to detect an amount of a current flowing through the first line when the memory cell is accessed and adjust a voltage of the first or second line based on the amount of the current.

Nonvolatile semiconductor memory devices according to the embodiments will now be explained in detail with reference to the drawings.

First Embodiment

Figure 1:
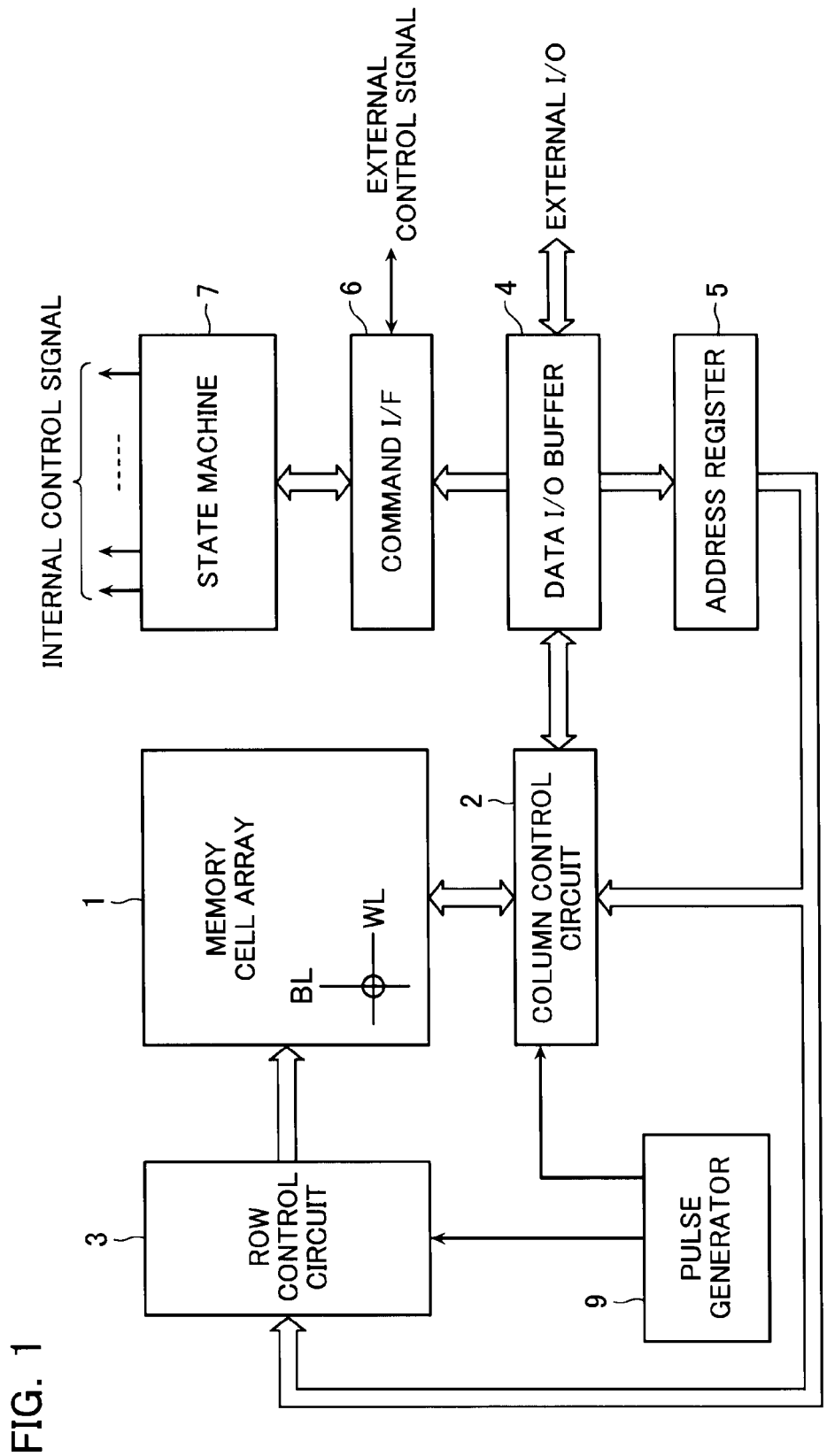
FIG. 1 is a block diagram of a nonvolatile memory according to a first embodiment.

FIG. 1 is a block diagram of a nonvolatile memory according to a first embodiment.

The nonvolatile memory includes a memory cell array 1 configured as a matrix arrangement of memory cells each using a ReRAM (a variable resistance element) described later. A column control circuit 2 is provided at a location adjoining the memory cell array 1 in the direction along bit lines BL. The column control circuit 2 is configured to control the bit lines BL of the memory cell array 1 to execute erasing of data from the memory cells, writing of data into the memory cells, and reading of data from the memory cells. A row control circuit 3 is provided at a location adjoining the memory cell array 1 in the direction along word lines WL. The row control circuit 3 is configured to select the word lines WL of the memory cell array 1 to apply voltages necessary for erasing of data from the memory cells, writing of data into the memory cells, and reading of data from the memory cells.

A data input/output buffer 4 is connected to an unillustrated external host through an I/O line and executes receiving of write data, receiving of an erase instruction, output of read data, and receiving of address data and command data. The data input/output buffer 4 sends received write data to the column control circuit 2, and receives read data from the column control circuit 2 and externally outputs the read data. An address externally supplied to the data input/output buffer 4 is sent to the column control circuit 2 and the row control circuit 3 through an address register 5. A command supplied to the data input/output buffer 4 from the host is sent to a command interface 6. The command interface 6 receives an external control signal from the host, determines whether data input in the data input/output buffer 4 is write data, a command, or an address, and when it is a command, transfers it to a state machine 7 as a received command signal. The state machine 7 manages the entire semiconductor memory device, and receives a command from the host to execute reading, writing, erasing, and management of data input/output. The external host is capable of receiving status information managed by the state machine 7 and determining an operation result. The status information is also used for controlling writing and erasing.

A pulse generator 9, which is a voltage supplying circuit, is controlled by the state machine 7. Under this control, the pulse generator 9 becomes able to output a pulse of an arbitrary voltage at an arbitrary timing. Specifically, the state machine 7 receives an externally supplied address through the address register 5, determines which memory layer is accessed by the address, and controls the height and width of a pulse to be generated by the pulse generator 9 by using a parameter corresponding to the determined memory layer. This parameter indicates a value calculated by grasping the characteristic of a writing characteristic, etc. of each memory layer and ensuring that the writing characteristics of the respective memory layers become uniform. This parameter is stored in a memory cell. The generated pulse can be transferred to arbitrary lines selected by the column control circuit 2 and the row control circuit 3.

Peripheral circuit elements other than the memory cell array 1 can be formed in a portion of a silicon substrate immediately under the memory cell array 1. Therefore, the chip area of the semiconductor memory device can be substantially equal to the area of the memory cell array 1.

Figure 2:
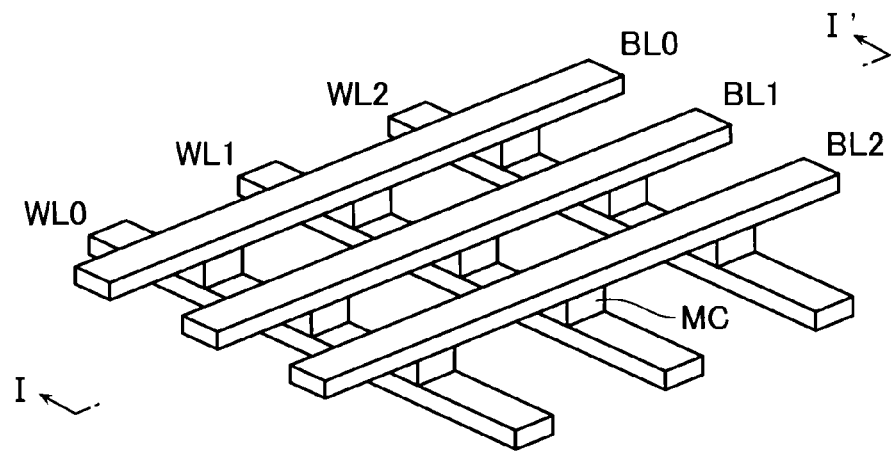
FIG. 2 is a perspective diagram of apart of a memory cell array of the nonvolatile memory according to the first embodiment.
Figure 3:
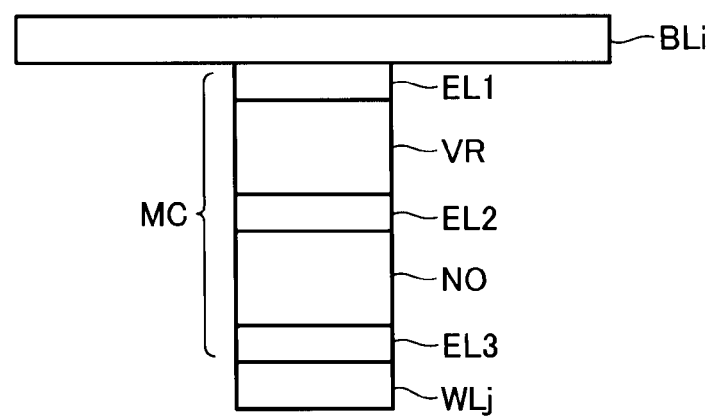
FIG. 3 is a cross section of one memory cell taken along a line I-I' of FIG. 2 and seen as indicated by arrows.

FIG. 2 is a perspective diagram of a part of the memory cell array 1. FIG. 3 is a cross section of one memory cell taken along a line I-I' of FIG. 2 and seen as indicated by the arrows.

Word lines WL0 to WL2 as a plurality of first lines are provided in parallel, and bit lines BL0 to BL2 as a plurality of second lines are provided in parallel to intersect the word lines. Memory cells MC are disposed at the intersections of these lines as sandwiched between these lines. The word lines WL and the bit lines BL are preferably made of a material that is heat-resistant and has a low resistance, and may be made of, for example, W, WSi, NiSi, CoSi, etc.

As shown in FIG. 3, the memory cell MC is a series circuit of a variable resistance element VR and a non-ohmic element NO.

The variable resistance element VR can vary its resistance by a current, heat, chemical energy, etc. in response to voltage application. The variable resistance element VR includes electrodes EL1 and EL2 provided at the top and the bottom to function as a barrier metal and an adhesive layer. An electrode material may be Pt, Au, Ag, TiAlN, SrRuO, Ru, RuN, Ir, Co, Ti, TiN, TaN, LaNiO, Al, PtIrO$_x$, PtRhO$_x$, Rh/TaAlN, etc. The variable resistance element VR may also include a metal film that provides a uniform orientation. Further, the variable resistance element VR may specially include a buffer layer, a barrier metal layer, an adhesive layer, etc.

The variable resistance element VR may be an element (a ReRAM) which is made of a complex compound containing cations to become a transition element, and which varies its resistance in response to cation migration.

Figure 4:
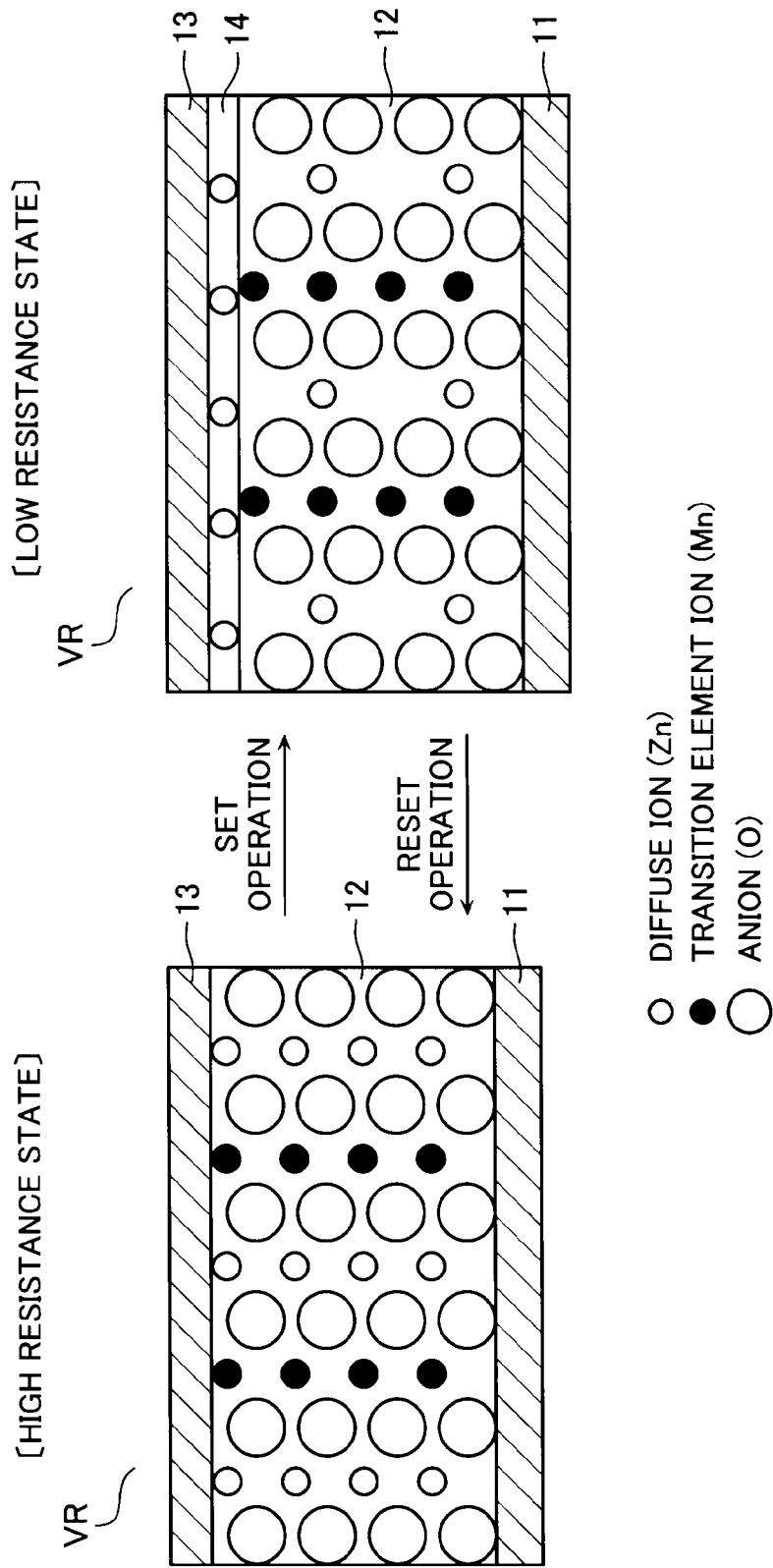
FIG. 4 is an exemplary cross section showing an example of a variable resistance element of the nonvolatile memory according to the first embodiment.

FIG. 4 is a diagram showing an example of the variable resistance element VR. The variable resistance element VR shown in FIG. 4 includes electrodes layers 11 and 13, and a recording layer 12 provided between them. The recording layer 12 is made of a complex compound containing at least two kinds of cationic elements. At least one kind of the cationic elements should be a transition element having a d-orbital incompletely filled with electrons, and the shortest distance between adjoining cationic elements should be 0.32 nm or shorter. Specifically, the recording layer 12 is made of a material which is represented by a chemical formula $A_xM_yX_z$ (where A and M are different elements), and which has a crystalline structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), a perovskite structure ($AMO_3$), etc.

In the example of FIG. 4, A is Zn, M is Mn, and X is O. Small white circles in the recording layer 12 represent diffuse ions (Zn), large white circles represent anions (O), and small black circles represent transition element ions (Mn). An initial state of the recording layer 12 is a high resistance state. When a negative voltage is applied to the electrode layer 13 while the electrode layer 11 is set at a fixed potential, some diffuse ions in the recording layer 12 migrate toward the electrode layer 13, and hence diffuse ions in the recording layer 12 are reduced relative to anions. The diffuse ions having migrated toward the electrode layer 13 receive electrons from the electrode layer 13 and precipitate as a metal, thus forming a metal layer 14. In the recording layer 12, anions have become excessive, and this leads to an increase of the valence of the transition element ions in the recording layer 12. Hence, the recording layer 12 becomes electron-conductive due to carrier injection, and a setting operation of the recording layer 12 is thus completed. To reproduce the data, such a minute current as would not induce a resistance change of the material of the recording layer 12 is caused to flow through the recording layer 12. To reset the programmed state (low resistance state) to the initial state (high resistance state), for example, a large current is caused to flow through the recording layer 12 for a sufficient time to cause Joule heating and promote the oxidoreduction reaction of the recording layer 12. It is also possible to execute a reset operation by applying an electric field in a direction opposite to the set operation.

Figure 5:
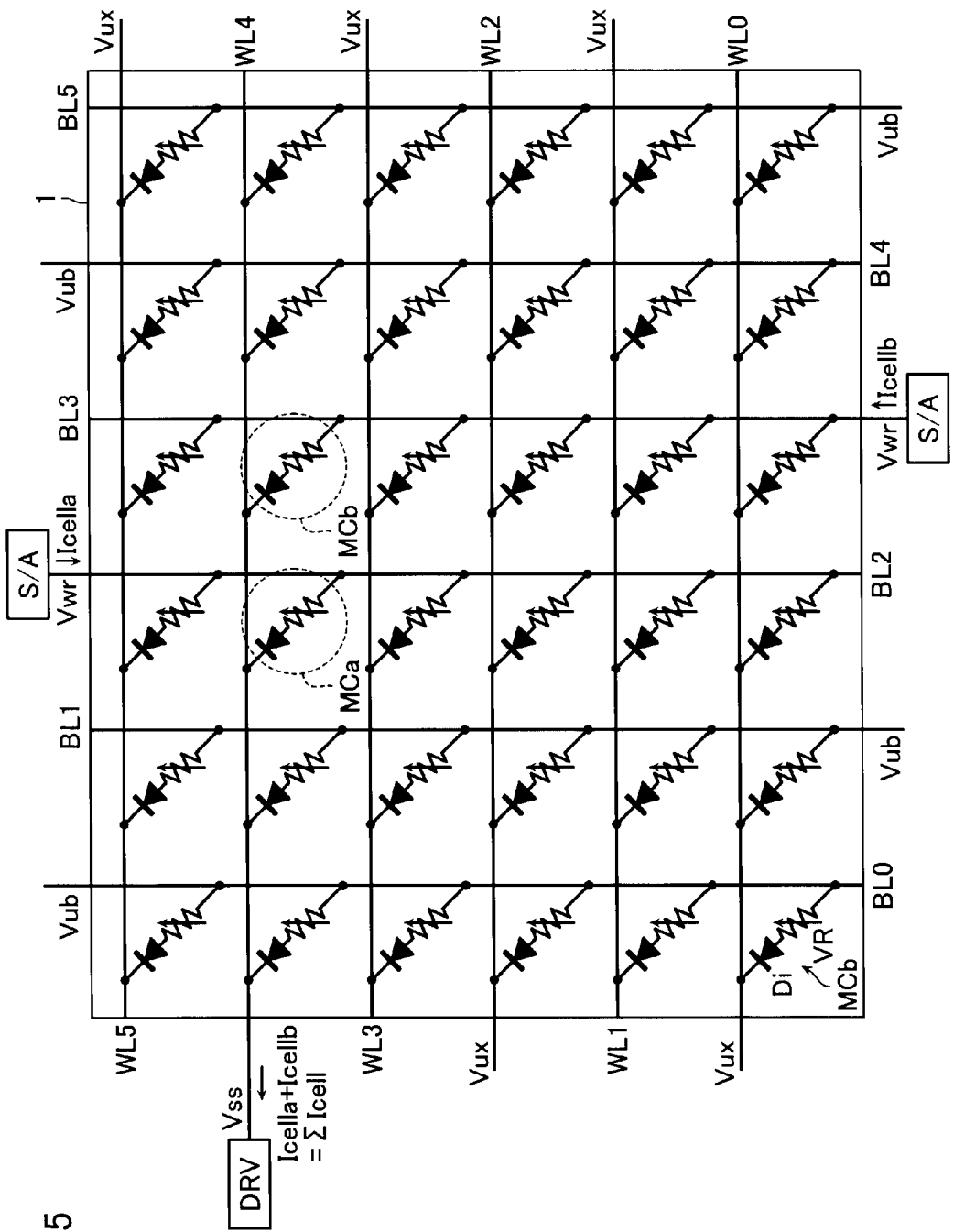
FIG. 5 is a circuit diagram of the memory cell array of the nonvolatile memory according to the first embodiment.

FIG. 5 is an equivalent circuit diagram showing the details of the memory cell array 1 shown in FIG. 1. Here, a diode Di is used as the non-ohmic element NO, and for simplicity, the following explanation is given on the assumption that the memory cell array 1 is a single-layered structure.

In FIG. 5, the memory cells MC of the memory cell array 1 are each configured by a diode Di and a variable resistance element VR which are series-connected. A cathode of the diode Di is connected to a word line WL, and an anode thereof is connected to a bit line BL via the variable resistance element VR. Each bit line BL is provided with a sense amplifier S/A of the column control circuit 2. Various types of sense amplifier S/A can be used, such as a single end type, a differential type using a reference cell, etc. The word lines WL are provided with word line drivers DRV of the row control circuit 3. The word line driver DRV supplies the word line WL with a voltage necessary for writing/erasing of data, or reading of data.

The memory cells MC may be selected individually, or data stored in a plurality of memory cells MC connected to a selected word line WL may be read out simultaneously. The memory cell array 1 may allow a current to flow from the word line WL to the bit line BL by reversing the polarities of the diode Di from what they are in the circuit shown in FIG. 5.

Next, an operation of the nonvolatile memory having the above configuration will be explained.

A case is assumed that the memory cell MCa connected to the word line WL4 and the bit line BL2 and the memory cell MCb connected to the word line WL4 and the bit line BL3 as indicated within dotted-line circles in FIG. 5 are the selected memory cells, and these memory cells MCa and MCb are the target of access.

Erasing of data (writing of data "1") is executed by a reset operation of causing a current of about 1 μA to 10 μA to flow for 500 ns to 2 μs by, for example, applying a ground voltage Vss to the selected word line WL4, applying a voltage Vux lower than a writing voltage Vwr by about 0.8V to the other word lines WL, applying the writing voltage Vwr to the selected bit lines BL2 and BL3, and applying a voltage Vub higher than the ground voltage Vss by about 0.8V to the other bit lines BL.

Writing of data (writing of data "0") is executed by a set operation of causing a current of about 10 nA to flow for 10 ns to 100 ns by, for example, applying a ground voltage Vss to the selected word line WL4, applying a voltage Vux lower than a writing voltage Vwr by about 0.8V to the other word lines WL, applying the writing voltage Vwr to the selected bit lines BL2 and BL3, and applying a voltage Vub higher than the ground voltage Vss by about 0.8V to the other bit lines BL.

Reading of data is executed by a read operation of applying a voltage Vssrow close to a ground potential to the selected word line WL4 and the unselected bit lines BL, and applying a voltage Vux to the selected bit lines BL2 and BL3 and the unselected word lines WL. The voltage Vux-Vssrow applied at this time is a voltage that does not induce changes of the resistance state of the variable resistance element VR of the selected memory cells MCa and MCb. At this time, the sense amplifiers S/A monitor currents Icella and Icellb flowing through the selected memory cells MCa and MCb, and discriminate whether the resistance state of the variable resistance element VR of the memory cells MCa and MCb is a low resistance state (data "0") or a high resistance state (data "1").

Next, the memory cells of the nonvolatile memory realizing the above-describe set/reset operation and read operation and peripheral circuits of the nonvolatile memory will be explained. However, before starting this explanation, a nonvolatile memory according to a comparative example will be explained with reference to FIG. 23 and FIG. 24.

Figure 23:
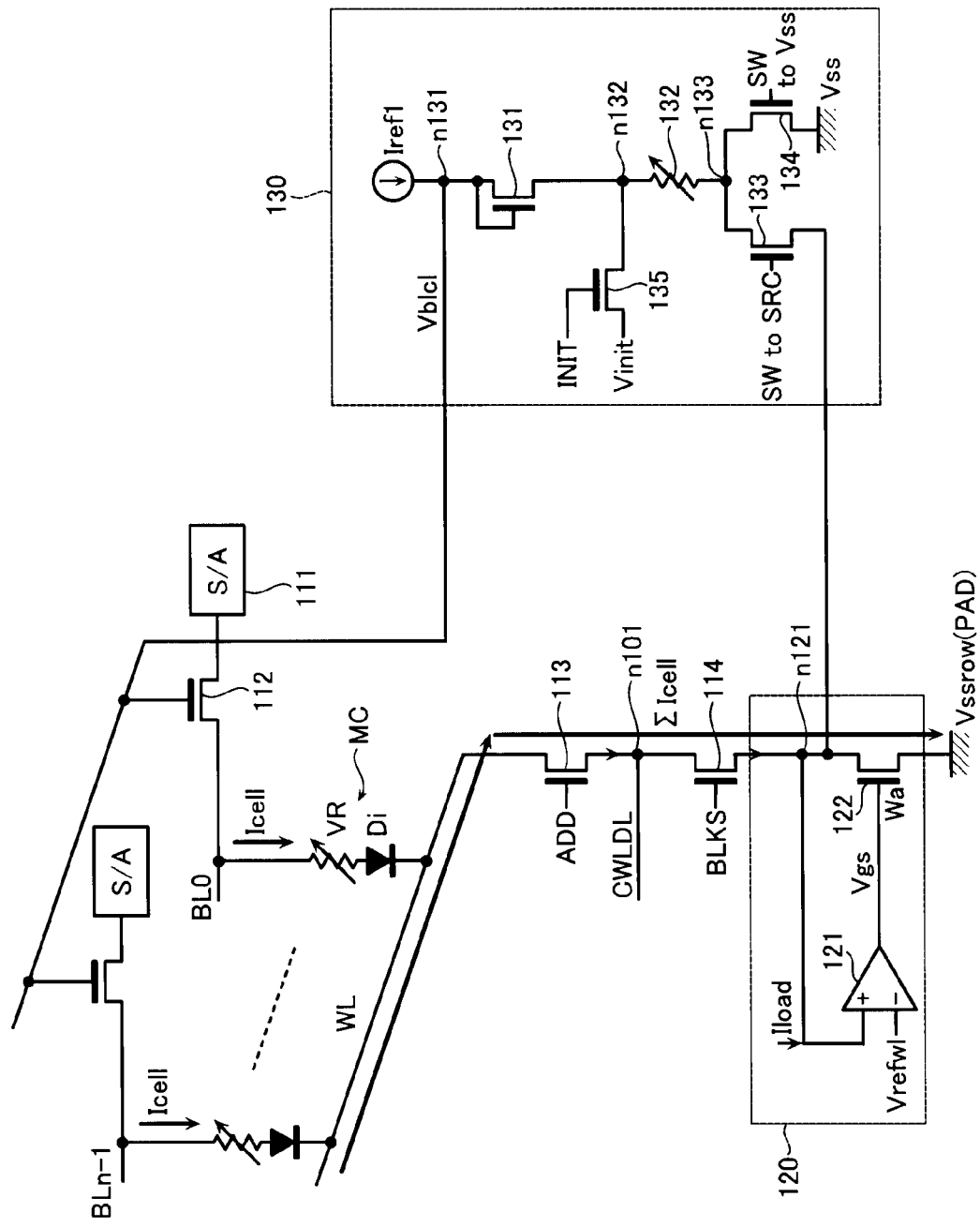
FIG. 23 is a circuit diagram showing a part of a memory cell array of a nonvolatile memory according to a comparative example and peripheral circuits thereof.

FIG. 23 is a circuit diagram showing a memory cell array of a nonvolatile memory according to the comparative example and peripheral circuits of the nonvolatile memory.

A plurality of bit lines BL of the memory cell array 1 are connected to a common word line WL through memory cells MC connected to them respectively. This word line WL is connected to a word line driver 120 through a transistor 113 and a transistor 114. The word line driver 120 is a voltage regulator circuit. The transistor 113 is switched on/off by an address signal ADD. The transistor 114 is switched on/off by a block select signal BLKS. The block select signal BLKS is a signal that simultaneously selects such blocks that are assigned addresses within a certain range. A node n101 between the transistors 113 and 114 is connected to a common word line driver line CWLDL shared by word lines WL belonging to a block.

The word line driver 120 belongs to a row control circuit 3, and includes an amplifier 121. The amplifier 121 has a non-inverting input terminal (+) supplied with a voltage of a node n121 disposed at the source side of the transistor 114 and an inverting input terminal (−) supplied with a word line reference voltage Vrefwl serving as a reference for the voltage of the word line WL. The amplifier 121 outputs a voltage corresponding to the difference between these voltages. The word line driver 120 also includes a transistor 122 provided between the node n121 and a PAD of a voltage Vssrow. The transistor 122 is controlled by an output Vgs of the amplifier 121, thereby executing voltage regulation of the voltage of the node n121 such that the voltage becomes equal to the word line reference voltage Vrefwl.

The bit lines BL of the memory cell array 1 are respectively connected, through charge transfer transistors 112, to sense amplifiers 111 belonging to a column control circuit 2. The charge transfer transistor 112 is controlled by a bit line clamp voltage Vblcl generated by a bit line clamp circuit 130 described later.

The bit line clamp circuit 130 belongs to the column control circuit 2, and includes: a constant current source Iref1; a diode-connected transistor 131 connected through a node n131; a variable resistance element 132 connected through a node n132; a transistor 133 connected between a node n133 and the node n121; and a transistor 134 connected between the node n133 and the ground. The transistor 131 and the variable resistance element 132 monitor the charge transfer transistor 112 and the memory cells MC. By controlling the transistors 133 and 134 in a manner that one is switched on when the other is switched off, it is possible to select whether to set the node n133 to the voltage of the word line WL or to a ground voltage Vss. The node n132 is supplied with an initializing voltage Vinit through a transistor 135 controlled by an initializing signal INIT.

Next, with reference to FIG. 24, operation waveforms in a data read operation of the nonvolatile memory shown in FIG. 23 will be explained.

First, during a period P1, a selected bit line BL is pre-charged to the initial voltage Vinit. Meanwhile, a selected word line WL, which is selected by the block select signal BLKS and the address signal ADD and which would inherently become the constant voltage Vrefwl determined by the word line driver 120, becomes a voltage Vwl higher than the voltage Vrefwl by an amount corresponding to source-drain voltages occurred in the transistors 113 and 114 respectively.

After the selected bit line BL is pre-charged to the initial voltage Vinit, the sense amplifier 111 is activated during a period P5 in order to sense and amplify a current Icell flowing through the selected memory cell MC and discriminate the resistance state of the variable resistance element VR of the selected memory cell MC.

Figure 24:
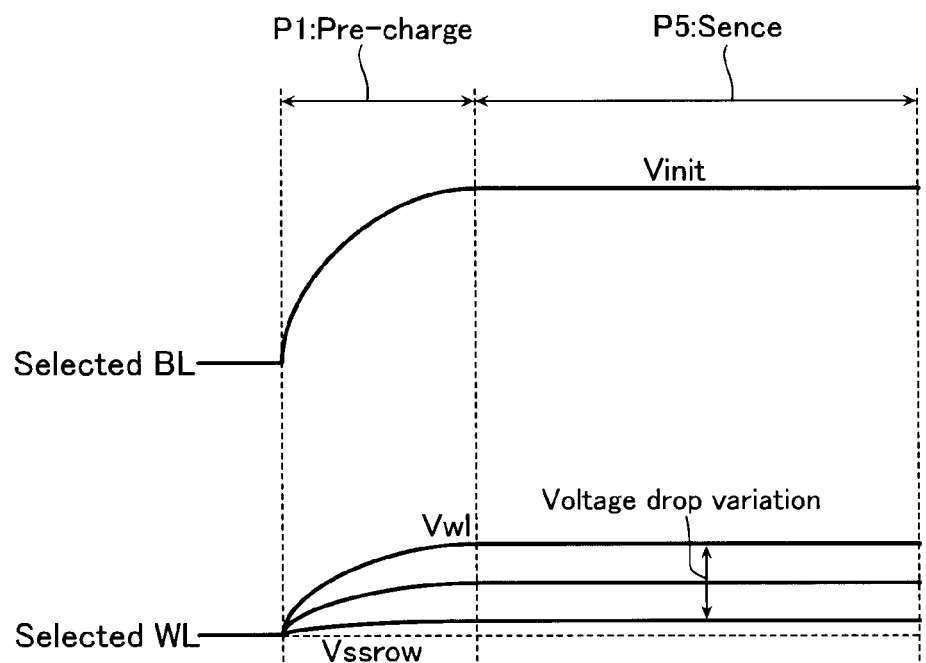
FIG. 24 shows operation waveform charts of the nonvolatile memory according to the comparative example.

However, since the word line WL actually has an interconnection resistance, the voltage level of the word line WL varies depending on the positions of the selected memory cells MC as shown in FIG. 24. That is, different memory cells MC to be selected have different read margins.

This is true for a data write operation, and the influence of this variation is unignorable especially in a reset operation which requires a relatively large current.

When a plurality of memory cells MC are accessed simultaneously, currents Icell flowing through the respective memory cells MC join together on one word line WL. In the case shown in FIG. 5, the current Icella flowing through the memory cell MCa and the current Icellb flowing through the memory cell MCb join together on one selected word line WL4. In such a case, the influence of the interconnection resistance of the selected word line WL increases further, and hence the accompanying variation of read margins and reset margins of the memory cells MC increases further. Therefore, the number of memory cells MC that can be accessed simultaneously is limited.

Figure 6:
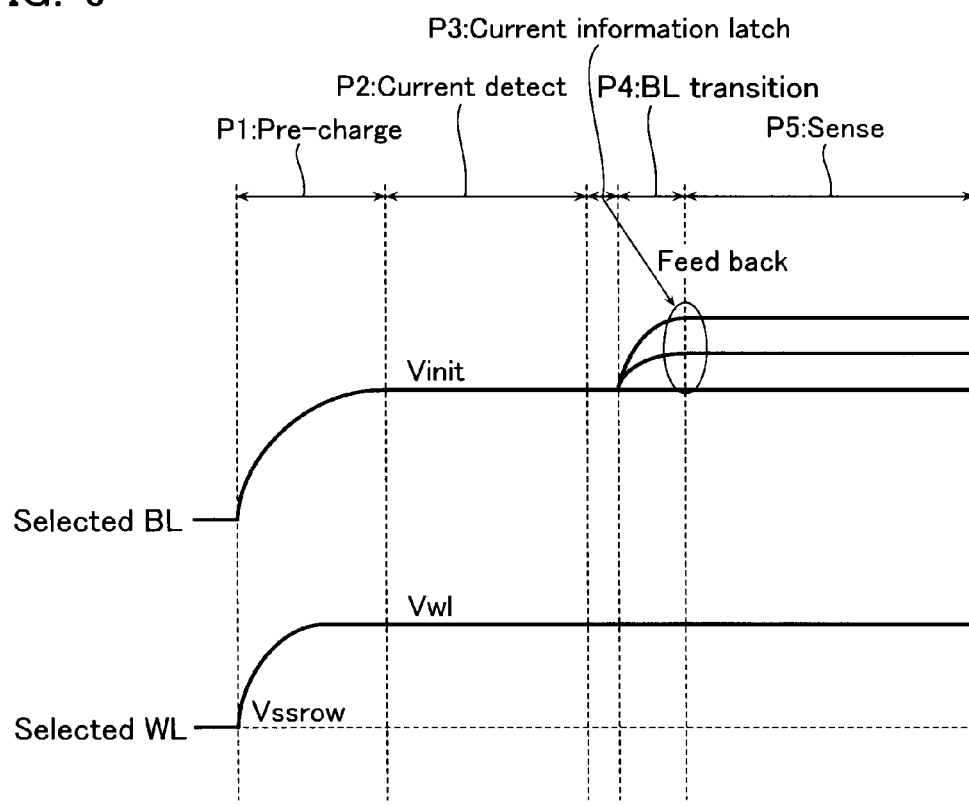
FIG. 6 shows operation waveform charts in a read operation of the nonvolatile memory according to the first embodiment.

Next, an outline of the present embodiment will be explained with reference to FIG. 6. FIG. 6 shows operation waveform charts of a selected bit line BL and a selected word line WL in a read operation.

First, during a period P1, the bit line BL and the word line WL are pre-charged to initial voltages Vinit and Vwl respectively.

Then, during a period P2, a total cell current ΣIcell flowing through the word line WL is detected. During a period P3, the information indicating the detected current is latched.

Then, during a period P4, an amount of correcting the voltage of the bit line BL is determined based on the current information latched during the period P3 and the address signal ADD of the selected memory cell MC, and the voltage of the bit line BL is adjusted.

Last, during a period P5, the sense amplifier 111 is activated to sense the current flowing through the sense node and discriminate the data.

By using the address information ADD and the total cell current ΣIcell, it is possible to grasp the position of the selected memory cell MC and the voltage drop caused by the word line WL and compensate for the variation of the read margins between selected memory cells MC.

Figure 7:
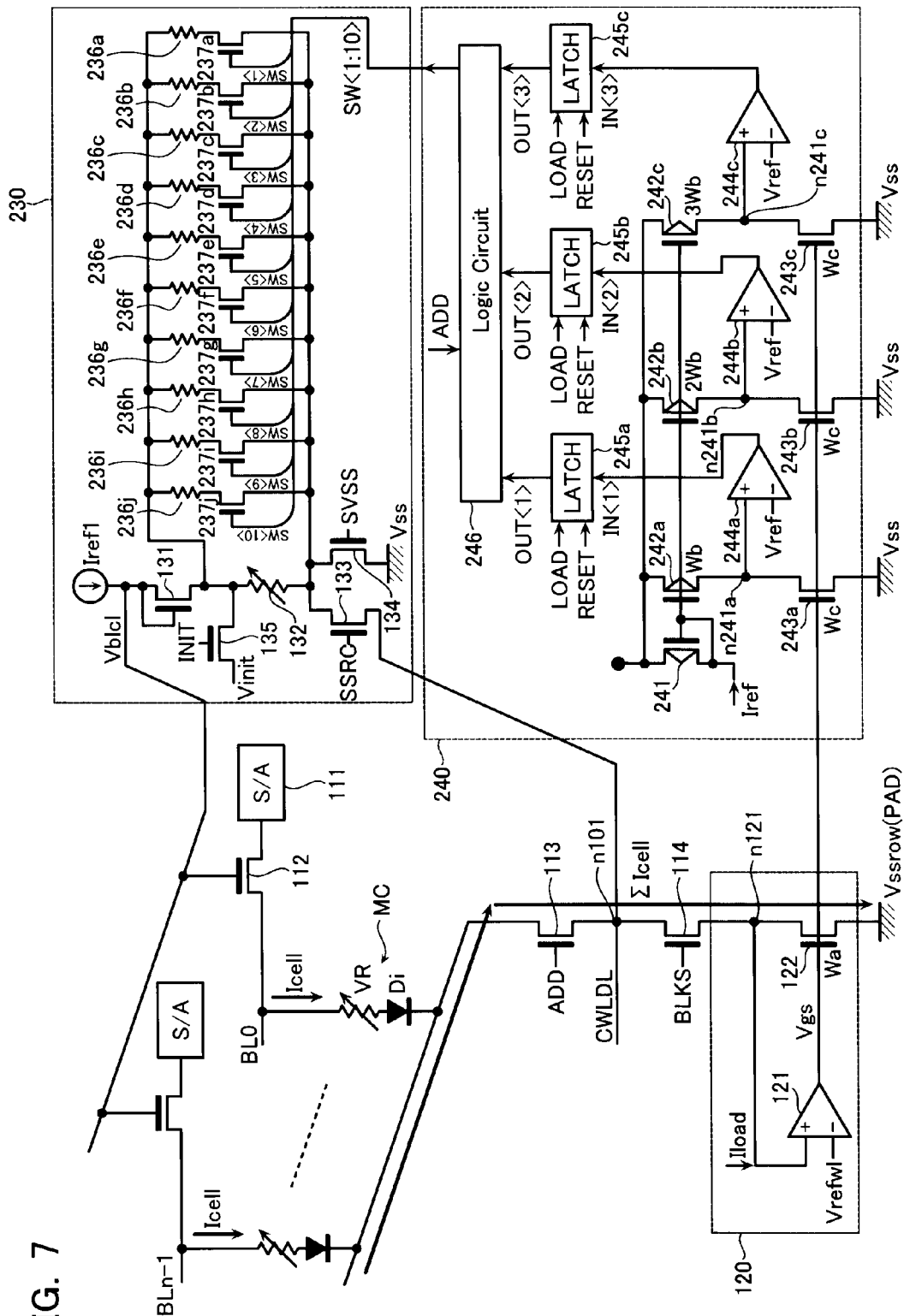
FIG. 7 is a circuit diagram showing the memory cell array of the nonvolatile memory according to the first embodiment and peripheral circuits thereof.

Next, a memory cell array 1 of a nonvolatile memory according to the present embodiment which realizes the operation shown in FIG. 6 and peripheral circuits of the memory cell array 1 will be explained with reference to FIG. 7.

This nonvolatile memory is different from the nonvolatile memory according to the comparative example shown in FIG. 23 in including a bit line clamp circuit 230 instead of the bit line clamp circuit 130 and in including a bit line voltage control circuit 240 configured as a control unit to monitor a total cell current ΣIcell.

In the bit line clamp circuit 230, a variable resistance element 132 corresponding to the variable resistance element 132 of the bit line clamp circuit 130 is parallel-connected to series circuits configured by a resistance element 236a and a transistor 237a, . . . , and a resistance element 236j and a transistor 237j, respectively. The resistance values of the resistance elements 236 are set to gradually increase from the element 236a to the element 236j. The transistors 237a to 237j are switched on/off individually by a switch control signal SW<1> to SW<10> sent by the bit line voltage control circuit 240 described later. The switch control signal SW is a signal including ten bits, and only one bit of them takes a value "1" ("H") and the remaining bits take a value "0" ("L"). For example, when the switch control signal SW<1> takes a value "1", only the transistor 237a is switched on. Therefore, the resistance element 236a having the smallest resistance value among the resistance elements 236 configures a parallel circuit with the variable resistance element 132. Conversely, when only the switch control signal SW<10> takes a value "1", the transistor 237j is switched on, and the resistance element 236j having the largest resistance value among the resistance elements 236 configures a parallel circuit with the variable resistance element 132. Therefore, as a higher-order bit takes a value "1", the bit line clamp voltage Vblcl becomes higher.

Figure 8:
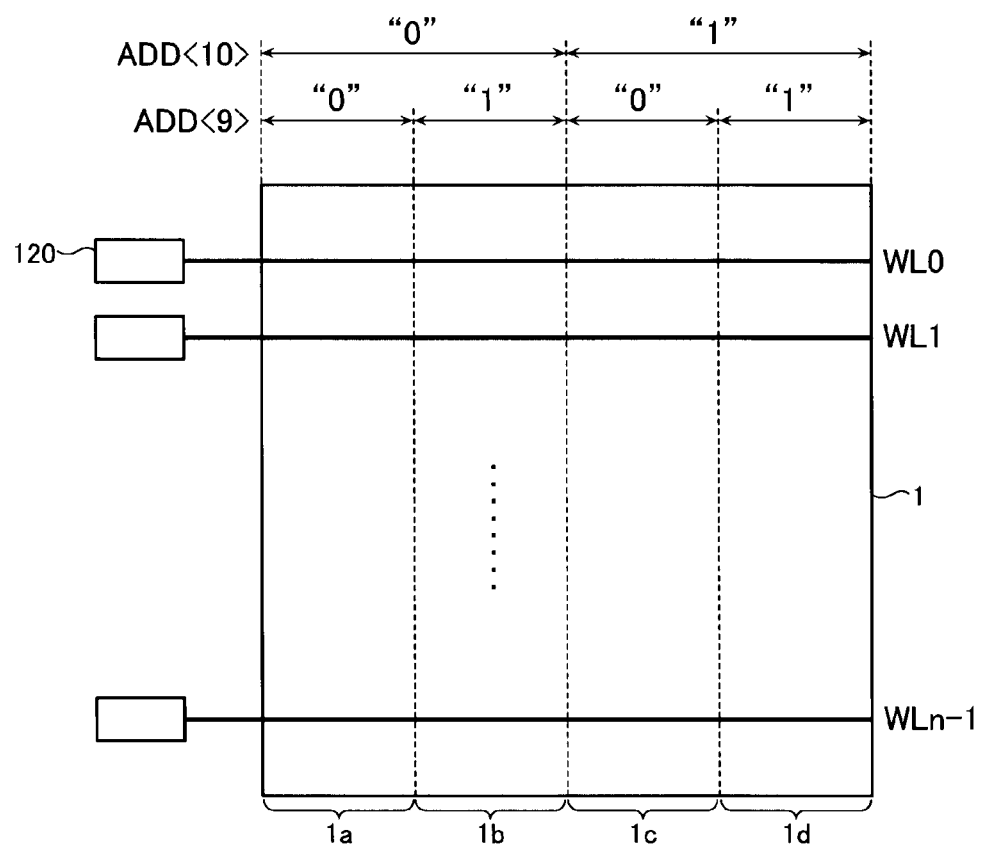
FIG. 8 is a diagram schematically showing address assignment in the nonvolatile memory according to the first embodiment.

Next, a method of determining the value of the switch control signal SW<1:10> will be explained. The following explanation will be provided on the assumption that the address assignment of the memory cell array 1 is as shown in FIG. 8. In FIG. 8, addresses are assigned in the order of memory cells MC closer to the word line driver 120. For example, when an address includes ten bits, the two highest-order bits ADD<10:9> of the address signal ADD can divide the memory cell array 1 into four regions from the word line driver 120 in the direction along the word line WL. Here, a region corresponding to the address ADD<10:9>="00" is a region 1a, a region corresponding to the address ADD<10:9>="01" is a region 1b, a region corresponding to the address ADD<10:9>="10" is a region 1c, and a region corresponding to the address ADD<10:9>="11" is a region 1d. In this case, when a memory cell MC located in the region 1a closest to the word line driver 120 is selected, a voltage drop caused by the word line WL is low, while when a memory cell MC located in the region 1d farthest from the word line driver 120 is selected, a voltage drop caused by the word line WL is high.

Figures 9, 10:
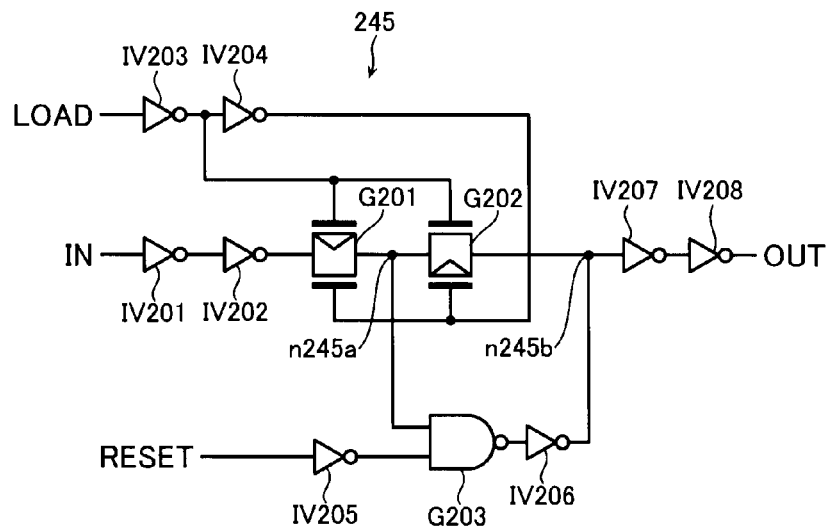
FIG. 9 is a truth table of a switch control signal of the nonvolatile memory according to the first embodiment.
FIG. 10 is a circuit diagram of a latch circuit of a bit line voltage control circuit of the nonvolatile memory according to the first embodiment.

FIG. 9 is a truth table of the switch control signal SW set based on the address assignment shown in FIG. 8. Here, a signal OUT represents a three-bit internal variable used by the bit line voltage control circuit 240 described later. The larger the variable is, the larger the total cell current ΣIcell flowing through the word line WL is. In the following explanation, the signal OUT will be referred to as latch output data.

In the truth table shown in FIG. 9, as the latch output data OUT becomes larger, i.e., as the current amount of the total cell current ΣIcell becomes larger, the bit of the switch control signal SW<1:10> that takes a value "1" moves to a higher-order place. As the value of the address signal ADD becomes larger, i.e., the farther from the word line driver 120 the region to which the selected memory cell MC belongs is, the width of bit movement due to the variation of the current amount of the total cell current ΣIcell becomes larger. By determining the value of the switch control signal SW in this manner, it is possible to roughly adjust the bit line clamp voltage Vblcl in a wider range for a region having a higher voltage drop due to the interconnection resistance, while minutely adjusting the bit line clamp voltage Vblcl for a region having a lower voltage drop due to the interconnection resistance.

Next, the bit line voltage control circuit 240 configured to generate the switch control signal SW of FIG. 9 will be explained.

The bit line voltage control circuit 240 includes the followings to function as an analog-digital converter: three transistors 243a to 243c each configuring a current mirror pair with the transistor 122 of the word line driver 120; a transistor 241 through which a reference current Iref serving as a reference for the current amount of the word line WL flows; transistors 242a to 242c having drains connected to the drains of the transistors 243a to 243c respectively and each configuring a current mirror pair with the transistor 241; and comparators 244a to 244c configured to compare the voltages of nodes n241 at which the transistors 242 are connected to the transistors 243 with a certain reference voltage Vref and output the comparison results. The bit line voltage control circuit 240 also includes the followings to function as a control signal generator: latch circuits 245a to 245c configured to latch the outputs of the comparators 244a to 244c; and a logic circuit group 246 including a plurality of logic circuits configured to generate the switch control signal SW corresponding to any combination of the outputs of the latch circuits 245a to 245c and to the address signal ADD and send the generated switch control signal SW to the bit line clamp circuit 230.

The gate widths of the transistors 242a, 242b, and 242c are, for example, Wb, 2×Wb, and 3×Wb, respectively. Therefore, when it is assumed that the current mirror ratio of the current mirror circuit configured by the transistors 241 and 242a is 1, the current mirror ratios of the current mirror circuits configured by the transistors 241 and 242b and by the transistors 241 and 242c are 2 and 3 respectively. Therefore, the source-drain voltages of the transistors 242a to 242c ascend in the order of the transistor 242a, the transistor 242b, and the transistor 242c. On the other hand, the gate widths of the transistors 243a to 243c are all Wc. Therefore, the current mirror ratios of the current mirror circuits configured by the transistor 122 of the word line driver 120 and the transistors 243a to 243c respectively are all the same. Hence, the rate of voltage rise at the node n241 due to increase of the total cell current ΣIcell is the highest at the node n241a, and the lowest at the node n241c. In other words, the values of the total cell current ΣIcell that bring the node n241 to the reference voltage Vref or higher ascend in the order of the node n241a, the node n241b, and the node n241c. Therefore, as the total cell current ΣIcell increases, the combinations of the outputs of the comparators 244a, 244b, and 244c shift from "'L'', "L", "L"' to "'H'', "L", "L"', to "'H'', "H", "L"', and to "'H'', "H", "H"'. Hence, the total cell current ΣIcell can be quantized into four levels. This quantized data is sent to the latch circuits 245a to 245c as latch input data IN<1> to IN<3>.

The circuit configuration of the latch circuit 245 is shown in FIG. 10.

The latch circuit 245 receives the latch input data IN output by the comparator 244, a load signal LOAD instructing update or retention of the data, and a reset signal RESET for resetting the retained data as inputs, and outputs the retained data to the logic circuit group 246 as the latch output data OUT. The load signal LOAD is generated by a logic circuit 246c of the logic circuit group 246 described later. The latch circuit 245 includes an inverter IV201, an inverter IV202, a transfer gate G201, a transfer gate G202, an inverter IV207, and an inverter IV208 which are series-connected and configured to transfer the latch input data IN. The output of the inverter IV208 is the latch output data OUT. The latch circuit 245 also includes an inverter IV203 and an inverter IV204 which are series-connected and configured to transfer the load signal LOAD. The output of the inverter IV203 is connected to the gate of the PMOS transistor configuring the transfer gate G201 and to the gate of the NMOS transistor configuring the transfer gate G202. The output of the inverter IV204 is connected to the gate of the NMOS transistor configuring the transfer gate G201 and to the gate of the PMOS transistor configuring the transfer gate G202. Therefore, when the load signal LOAD is "H", the transfer gate G201 is opened and the transfer gate G202 is closed. Conversely, when the load signal LOAD is "L", the transfer gate G202 is opened and the transfer transistor G201 is closed. The latch circuit 245 further includes: an inverter IV205; a NAND gate G203 configured to receive a node n245a between the transfer gates G201 and G202 and the output of the inverter IV205 as inputs; and an inverter IV206 configured to receive the output of the NAND gate G203 as an input. The output terminal of the inverter IV206 is connected to the input terminal of the inverter IV207. Therefore, when the load signal LOAD is "L" and the reset signal RESET is "L", data is retained by a flip-flop configured by the inverter IV206 and the NAND gate G203. On the other hand, when the reset signal RESET is "H", regardless of the data retained at a node n245b, the data of the nodes n245a and n245b and the latch output data OUT are reset to "0".

Figure 11:
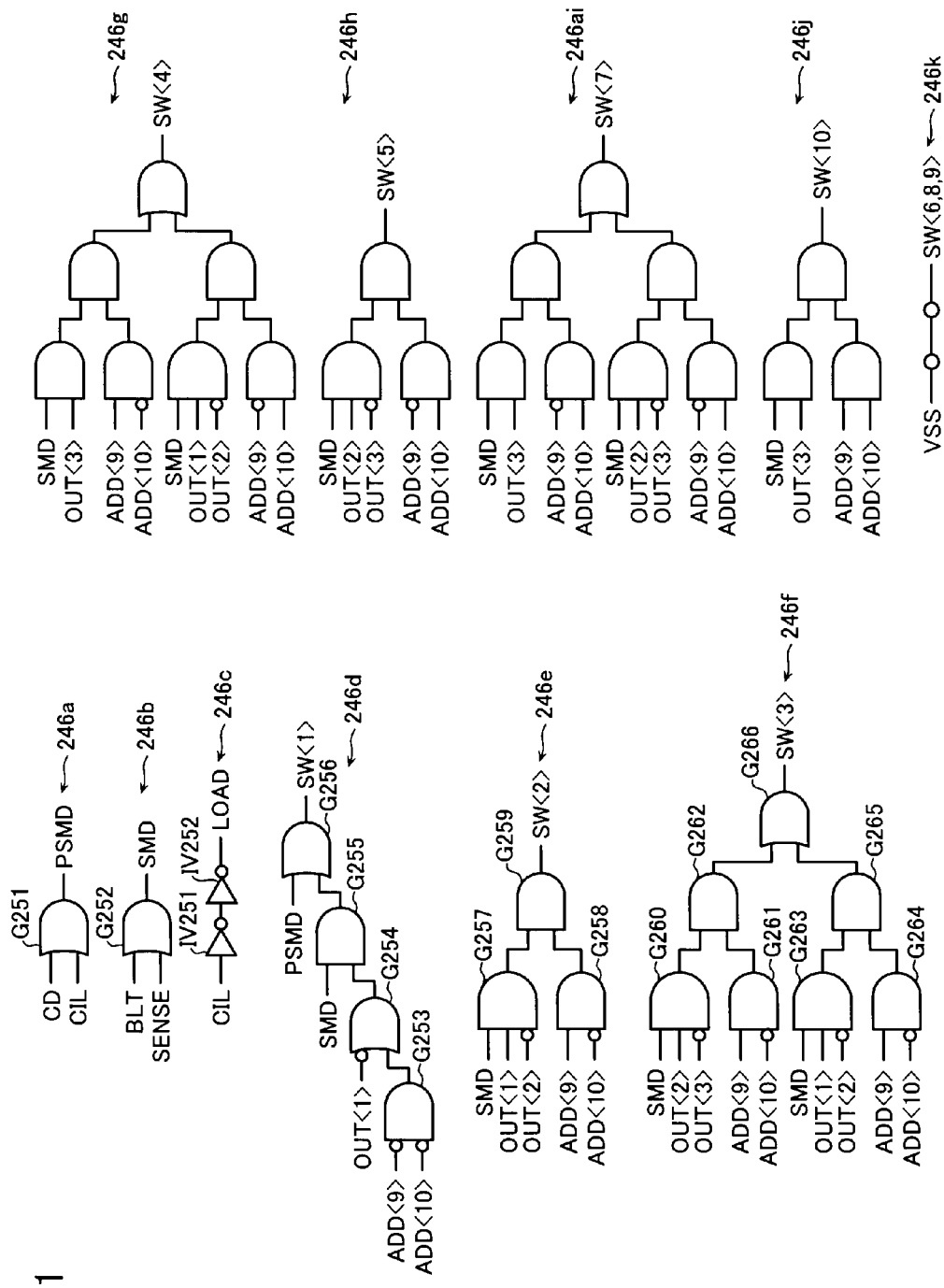
FIG. 11 is a circuit diagram of a logic circuit group of the bit line voltage control circuit of the nonvolatile memory according to the first embodiment.

The circuit diagram of the logic circuit group 246 is shown in FIG. 11.

The logic circuit group 246 is a circuit configured to output the switch control signal SW by receiving, as inputs, not only the latch output data OUT<1:3> output by the latch circuit 245 shown in FIG. 10 and the address signal ADD<9:10>, but also a current detect signal CD (Current Detect) indicating that the present time is the period P2 shown in FIG. 6, a current information latch signal CIL (Current Information Latch) indicating that the present time is the period P3, a bit line transition signal BLT (BL Transition) indicating that the present time is the period P4, and a sense signal SENSE indicating that the present time is the period P5.

The logic circuit group 246 includes logic circuits 246d to 246k configured to generate the switch control signal SW. The logic circuit group 246 also includes internal signals, namely a pre-sense mode signal PSMD (Pre-Sense MoDe) indicating that the present time is the periods P2 and P3, i.e., indicating a condition for acquiring data for compensating for the selected word line WL, and a sense mode signal SMD (Sense MoDe) indicating that the present time is the periods P3 and P4, i.e., indicating a condition for sensing the voltage of the word line WL after being compensated for. The logic circuit group 246 includes logic circuits 246a and 246b configured to generate the pre-sense mode signal PSMD and the sense mode signal SMD. The logic circuit group 246 further includes a logic circuit 246c configured to generate the above-described load signal LOAD based on the current information latch signal CIL.

The logic circuit 246a configured to generate the pre-sense mode signal PSMD includes an OR gate G251 which receives the current detect signal CD and the current information latch signal CIL as inputs. The output of the OR gate G251 is the pre-sense mode signal PSMD. That is, the pre-sense mode signal PSMD can be represented by a logical expression PSMD=CD+CIL.

The logic circuit 246b configured to generate the sense mode signal SMD includes an OR gate G252 which receives the bit line transition signal BLT and the sense signal SENSE as inputs. The output of the OR gate G252 is the sense mode signal SMD. That is, the sense mode signal SMD can be represented by a logical expression SMD=BLT+SENSE.

The logic circuit 246c configured to generate the load signal LOAD includes an inverter IV251 which receives the current information latch signal CIL as an input, and an inverter IV252 which receives the output of the inverter IV251 as an input. The output of the inverter IV252 is the load signal LOAD.

The logic circuit 246d configured to generate the switch control signal SW<1> includes: an AND gate G253 which receives signals obtained by inverting the addresses ADD<9> and ADD<10> as inputs; an OR gate G254 which receives the output of the AND gate G253 and a signal obtained by inverting the latch output data OUT<1> as inputs; an AND gate G255 which receives the output of the OR gate G254 and the sense mode signal SMD as inputs; and an OR gate G256 which receives the output of the AND gate G255 and the pre-sense mode signal PSMD as inputs. The output of the OR gate G256 is the switch control signal SW<1>. That is, the switch control signal SW<1> can be represented by a logical expression SW<1>=PSMD+(SMD·(/OUT<1>+((/ADD<9>·/ADD<10>)))) (the sign "/" means NOT; the same applies hereinafter.) It can be understood from this logical expression that in the sense mode, the switch control signal SW<1> is activated only when the selected memory cell MC is located in the region 1a shown in FIG. 8, and the current amount of the total cell current ΣIcell is the lowest level. Further, it can be understood that in the pre-sense mode, the switch control signal SW<1> is activated regardless of the address ADD of the selected memory cell MC and the level of the total cell current ΣIcell.

The logic circuit 246e configured to generate the switch control signal SW<2> includes: a three-input AND gate G257 which receives the sense mode signal SMD, the latch output data OUT<1>, and a signal obtained by inverting the latch output data OUT<2> as inputs; an AND gate G258 which receives the address ADD<9> and a signal obtained by inverting the address ADD<10> as inputs; and an AND gate G259 which receives the outputs of the AND gates G257 and S258 as inputs. The output of the AND gate G259 is the switch control signal SW<2>. That is, the switch control signal SW<2> can be expressed by a logical expression SW<2>=(SMD·OUT<1>·/OUT<2>)·(ADD<9>·/ADD<10>). It can be understood from this logical expression that the switch control signal SW<2> is activated only in the sense mode and when the selected memory cell MC is located in the region 1b shown in FIG. 8 and the current amount of the total cell current ΣIcell is the second lowest level.

The logic circuit 246f configured to generate the switch control signal SW<3> includes: an AND gate G260 which receives the sense mode signal SMD, the latch output data OUT<1>, and a signal obtained by inverting the latch output data OUT<2> as inputs; an AND gate G261 which receives the address ADD<9> and a signal obtained by inverting the address ADD<10> as inputs; and an AND gate G262 which receives the output of the AND gate G260 and the output of the AND gate G261 as inputs. The logic circuit 264f also includes: an AND gate G263 which receives the sense mode signal SMD, the latch output data OUT<1>, and a signal obtained by inverting the latch output data OUT<2> as inputs; an AND gate G264 which receives the address ADD<9> and a signal obtained by inverting the address ADD<10> as inputs; and an AND gate G265 which receives the output of the AND gate G263 and the output of the AND gate G264 as inputs. The logic circuit 264f further includes an OR gate G266 which receives the output of the AND gate G262 and the output of the AND gate G265 as inputs. The output of the OR gate G266 is the switch control signal SW<3>. That is, the switch control signal SW<3> can be represented by a logical expression SW<3>=((SMD·OUT<2>·/OUT<3>·ADD<9>·/ADD<10>))+((SMD·OUT<1>·/OUT<2>)·(ADD<9>·/ADD<10>). It can be understood from this logical expression that the switch control signal SW<3> is activated in the sense mode and when the selected memory cell MC is located in the region 1b shown in FIG. 8 and the current amount of the total cell current is the second highest level, or in the sense mode and when the selected memory cell MC is located in the region 1c shown in FIG. 8 and the current amount of the total cell current ΣIcell is the second highest level.

The logic circuits 246g, 246h, 246i, and 246j which generate the switch control signals SW<4>, SW<5>, SW<7>, and SW<10> respectively are configured likewise.

Since the switch control signals SW<6>, SW<8>, and SW<9> are never activated, they are connected to a grounding wire to the ground voltage Vss.

Next, a read operation of the nonvolatile memory having the above configuration will be explained in detail with reference to FIG. 6 again.

First, during the period P1, when a block select signal BLKS and an address signal ADD are supplied, certain corresponding transistors 113 and 114 are switched on and hence the selected word line WL and the word line driver 120 are electrically connected. Therefore, the selected word line WL is raised to the voltage Vwl. On the other hand, the selected bit line BL is pre-charged to the voltage Vinit.

Then, during the period P2, the memory cell current Icell flowing through the selected bit line BL and the selected memory cell MC joins on the selected word line WL. The joined total cell current ΣIcell is detected by the current mirror circuit configured by the transistors 122 and 243, and the current amount level thereof is quantized to become latch input data IN<1:3> to be input to the latch circuit 245.

Then, during the period P3, the current information latch signal CIL is activated and the load signal LOAD is subsequently activated. As a result, the latch input data IN<1:3> generated during the period P2 is retained by the latch circuit 245.

Then, during the period P4, the current information latch signal CIL is deactivated and the bit line transition signal BLT is activated, whereby the sense mode signal SMD is activated. Hence, any one bit of the switch control signal SW<1:10> becomes "1". Here, it is assumed that the address ADD<10:9> of the selected memory cell MC is "01" and the current amount of the total cell current ΣIcell is the second highest level. In this case, only the switch control signal SW<3> is turned to "1" by the logic circuit 246f. After this, the transistor 247c is switched on based on the value of the switch control signal SW. Accordingly, in the bit line clamp circuit 230, a parallel circuit of the variable resistance element 132 and the resistance element 236c is configured and the voltage across both ends of the variable resistance element 132 monitoring the selected memory cell MC rises by a certain degree. As a result, the bit line clamp voltage Vblcl, i.e., the gate voltage of the charge transfer transistor 112 provided for the bit line BL rises, and the voltage of the selected bit line BL rises by a certain degree. This series of operations can compensate for the voltage drop occurred on the word line WL on a selected-memory-cell-MC by selected-memory-cell-MC basis.

Last, during the period P5, the sense amplifier 111 connected to one end of the bit line BL senses and amplifies the data that appears on the selected bit line BL, and thus the read operation is completed.

Figure 12:
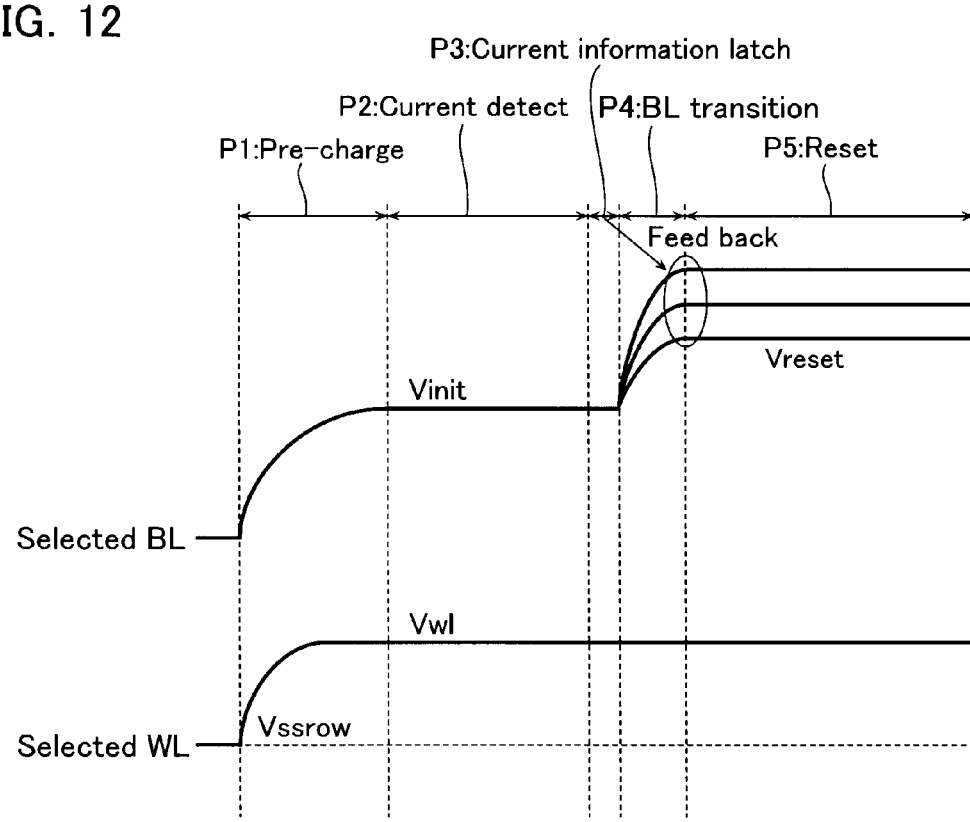
FIG. 12 shows operation waveform charts in a reset operation of the nonvolatile memory according to the first embodiment.

Next, a reset operation will be explained with reference to FIG. 12.

The reset operation follows the same process as the read operation from the period P1 to the period P3.

In the reset operation, it is necessary to raise the voltage of the bit line BL during the periods P4 and P5 to a voltage Vreset required for the reset operation. Here, since the combined resistance composed of the variable resistance element 132 and the resistance element 236 of the bit line clamp circuit 230 has been adjusted by the time the period P3 ends, the voltage Vreset which is adjusted is supplied.

As described above, the present embodiment adjusts the bit line clamp voltage Vblcl based on the total cell current and the address of the selected memory unlike the comparative example. As a result, it is possible to reduce the dependency of the voltage to be applied to the selected memory cell MC on the interconnection resistance of the word line and on the number of memory cells to be accessed simultaneously. Therefore, it becomes possible to improve the read margins and the reset margins and to realize more reliable memory cell access. Furthermore, it is possible to increase the number of memory cells that can be accessed simultaneously, and hence to realize fast read and reset operations.

Second Embodiment

Figure 13:
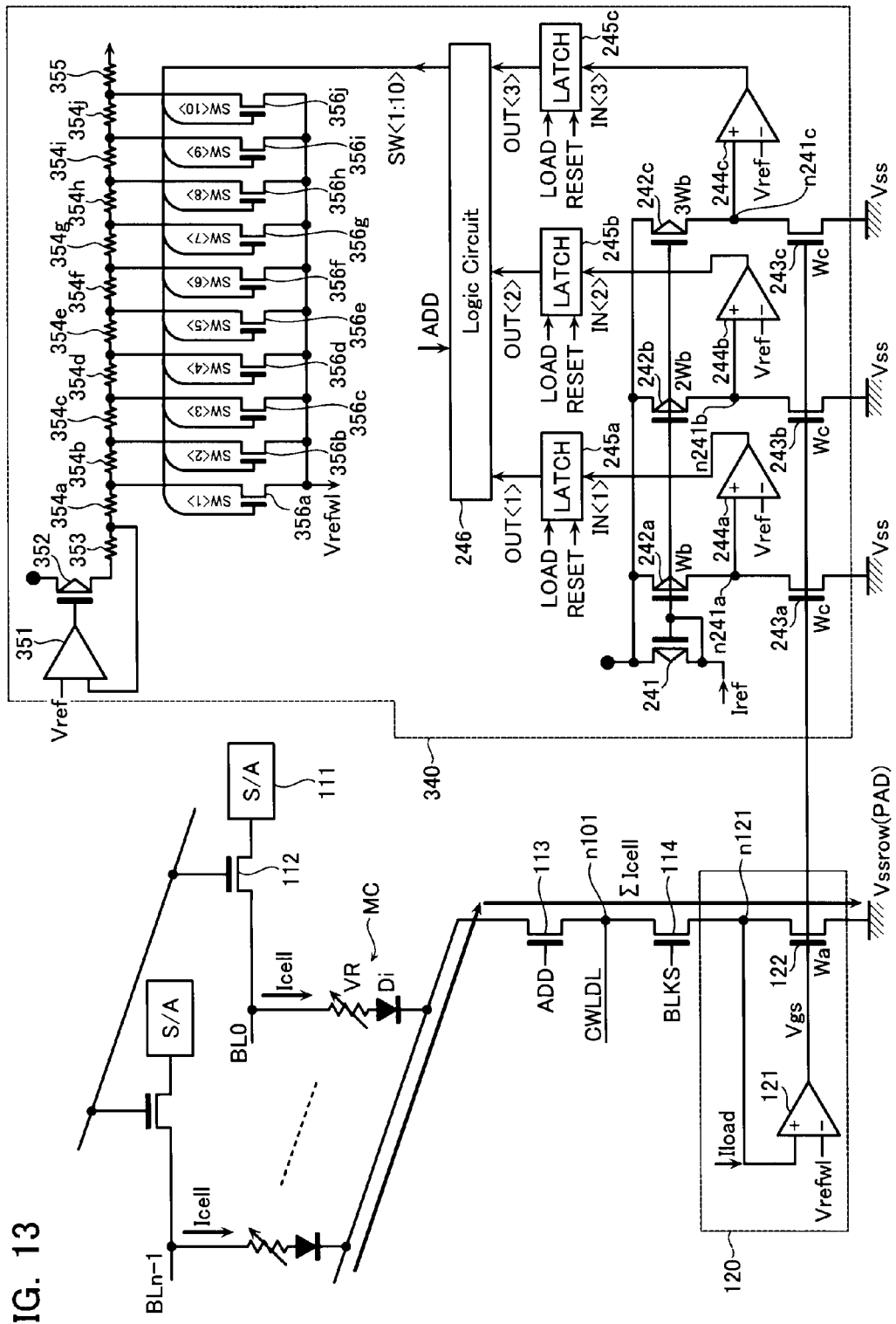
FIG. 13 is a circuit diagram showing a part of a memory cell array of a nonvolatile memory according to a second embodiment and peripheral circuits thereof.
Figure 14:
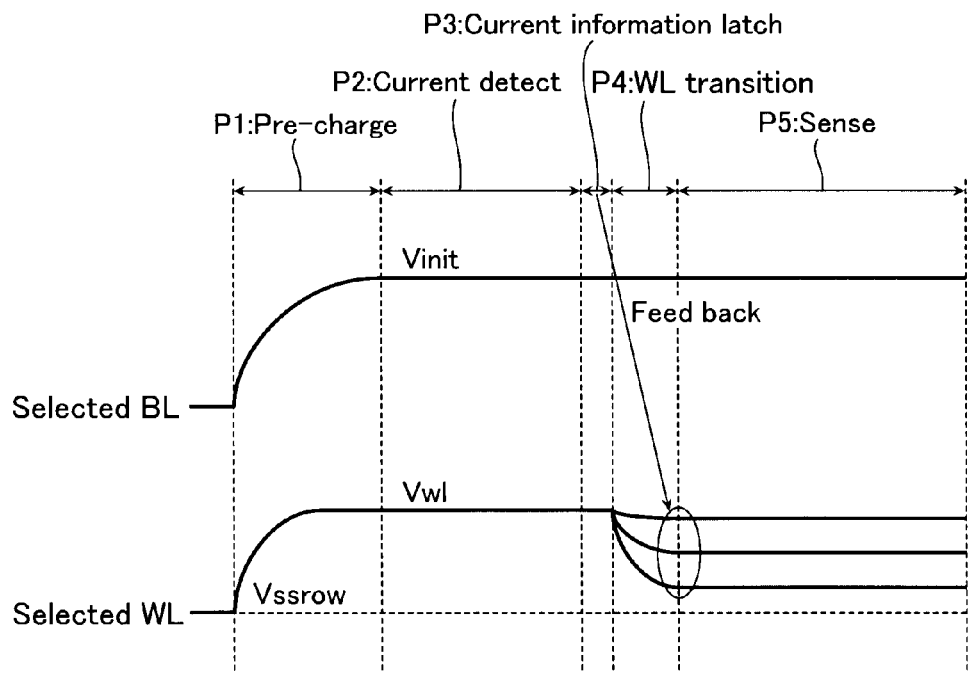
FIG. 14 shows operation waveform charts in a read operation of the nonvolatile memory according to the second embodiment.
Figure 15:
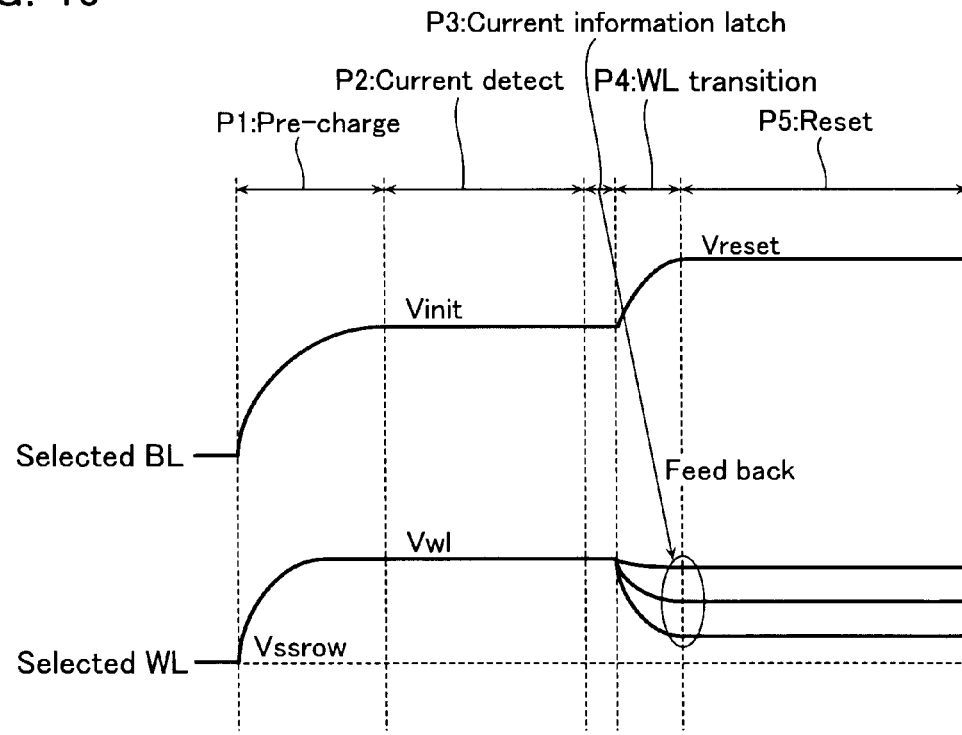
FIG. 15 shows operation waveform charts in a reset operation of the nonvolatile memory according to the second embodiment.

FIG. 13 shows a circuit diagram of a memory cell array 1 of a nonvolatile memory according to a second embodiment of the present invention and peripheral circuits of the memory cell array 1.

The present nonvolatile memory is different from the nonvolatile memory according to the comparative example shown in FIG. 23 in newly including a word line voltage control circuit 340 serving as a control unit.

The word line voltage control circuit 340 includes the same circuits as those of the bit line voltage control circuit 240 of the nonvolatile memory according to the first embodiment. Such circuits are denoted by the same reference numerals as used in FIG. 7. The word line voltage control circuit 340 includes: an amplifier 351 having an inverting input terminal (−) to which a certain reference voltage Vref is input; a transistor 352 controlled by the output of the amplifier 351; and resistance elements 353, 354a, ..., and 354j, and 355 series-connected to the drain of the transistor 352. The word line voltage control circuit 340 also includes transistors 356a to 356j. The drains of the transistors 356a, 356b, ..., and 356j are connected to the connection points between the resistance elements 354a and 354b, 354b and 354c, ..., and 354j and 355, respectively. On the other hand, the sources of the transistors 356a to 356j are commonly connected, and the voltage of this connection point is a word line reference voltage Vrefwl to be supplied to the word line driver. The transistors 356a to 356j are switched on/off by switch control signals SW<1> to SW<10> output by the logic circuit group 246 respectively.

Next, a read operation of the nonvolatile memory having the above configuration will be explained.

First, during a period P1, when a block select signal BLKS and an address ADD are supplied, certain corresponding transistors 113 and 114 are switched on, and the selected word line WL and the word line driver 120 are electrically connected. Therefore, the selected word line WL is raised to the voltage Vwl. Meanwhile, the selected bit line is pre-charged to the initial voltage Vinit.

Then, during a period P2, a memory cell current Icell flowing through the selected bit line BL and the selected memory cell MC joins on the selected word line WL. The joined total cell current ΣIcell is detected by the current mirror circuit configured by the transistors 122 and 243, and the current amount level thereof is quantized to become latch input data IN<1:3> to be input to the latch circuit 245.

Then, during a period P3, the current information latch signal CIL is activated and then the load signal LOAD is activated. As a result, the latch input data IN<1:3> generated during the period P2 is retained by the latch circuit 245.

Then, during a period P4, the current information latch signal CIL is deactivated and a word line transition signal WLT is activated, whereby the sense mode signal SMD is activated. Hence, any one bit of the switch control signal SW<1:10> becomes "1". Here, it is assumed that the address ADD<10:9> of the selected memory cell MC is "01" and the current amount of the total cell current ΣIcell is the second highest level. In this case, the switch control signal SW<3> is turned to "1" by the logic circuit 246f, and the corresponding transistor 356c is switched on. Accordingly, in the word line voltage control circuit 340, a voltage dividing circuit composed of a series circuit of the resistance elements 354a to 354c and a series circuit of the resistance elements 354d to 354j is configured, and the word line reference voltage Vrefwl is adjusted to a value obtained by dividing the word line reference voltage Vrefwl by the voltage dividing circuit. As a result, the word line reference voltage Vrefwl rises, and the voltage of the selected word line rises by a certain degree. This series of operations can compensate for the variation of the interconnection resistance which varies depending on the positions of the selected memory cells MC.

Last, during a period P5, the sense amplifier 111 connected to one end of the bit line BL senses and amplifies the data that appears on the selected bit line BL, and the read operation is completed.

A reset operation is the same as the read operation except that the voltage of the bit line BL is raised during the periods P4 and P5 to a voltage Vreset necessary for the reset operation.

As described above, the present embodiment compensates for the voltage drop occurred on the word line WL by adjusting the voltage of the word line WL unlike the first embodiment. Also in this case, the voltage applied to the memory cell MC is the potential difference between the bit line BL and the word line WL. Therefore, the same effect as the first embodiment can be obtained.

Third Embodiment

In the third embodiment of the present invention, as a preliminary operation before a set/reset/read operation (hereinafter, this operation will be referred to as "pre-read operation"), an operation of detecting and storing in an analog manner a voltage drop caused by a word line path is executed, in order to compensate for a voltage drop on the word line WL in a set/reset/read operation.

Figure 16:
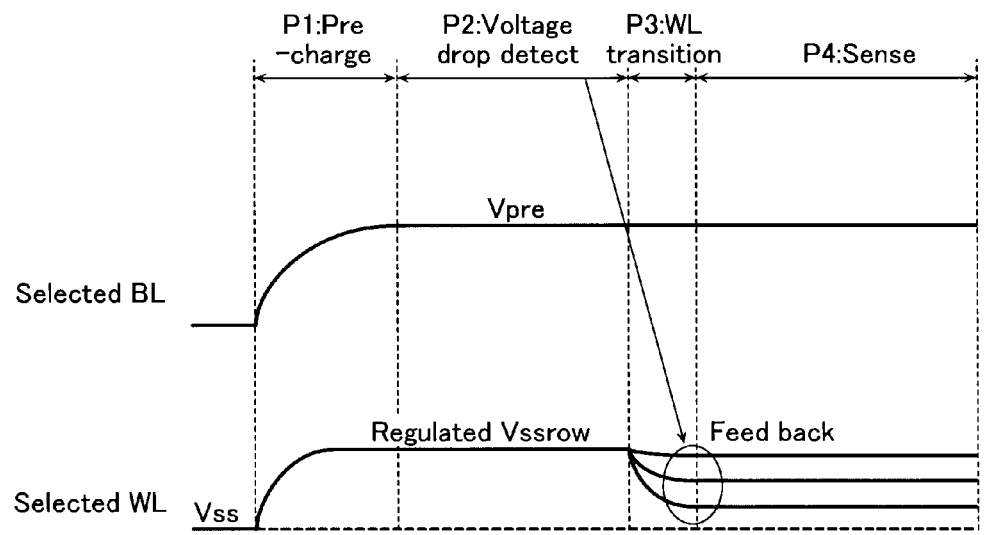
FIG. 16 shows operation waveform charts in a read operation of the nonvolatile memory according to the second embodiment.

First, an outline of a read operation according to the present embodiment will be explained with reference to the operation waveform charts of the selected bit line BL and the selected word line WL shown in FIG. 16.

First, during a period P1, the bit line BL is charged to a voltage Vpre necessary for a pre-read operation (hereinafter referred to as "pre-read voltage), and the voltage of the word line WL is stepped down to a row ground voltage Vssrow.

Then, during a period P2, an amount of a voltage drop ΔVwl caused by the word line path is detected.

Then, during a period P3, the amount of the voltage drop ΔVwl detected during the period P2 is fed back to lower the voltage of the word line WL by the amount of the voltage drop ΔVwl.

Last, during a period P4, a cell current Icell flowing through the selected memory cell MC is sensed and amplified by the sense amplifier 111 to discriminate the data of the selected memory cell MC. Note that the pre-read voltage Vpre has been continuously supplied to the bit line BL because a pre-read operation is substantially the same as a read operation for the memory cell MC.

In the above read operation, the amount of the voltage drop ΔVwl corresponding to the position of the selected memory cell MC is detected during the period P2, and the voltage of the word line WL is compensated for based on the detected value. Therefore, it is possible to obtain a uniform read characteristic that is not dependent on the position of the selected memory cell MC.

Next, an outline of a reset operation according to the present embodiment will be explained with reference to the operation waveform charts of the selected bit line BL and the selected word line WL shown in FIG. 17.

The reset operation is the same as the read operation except that the bit line BL is boosted during a period P3 to a voltage Vreset necessary for the reset operation.

Figure 17:
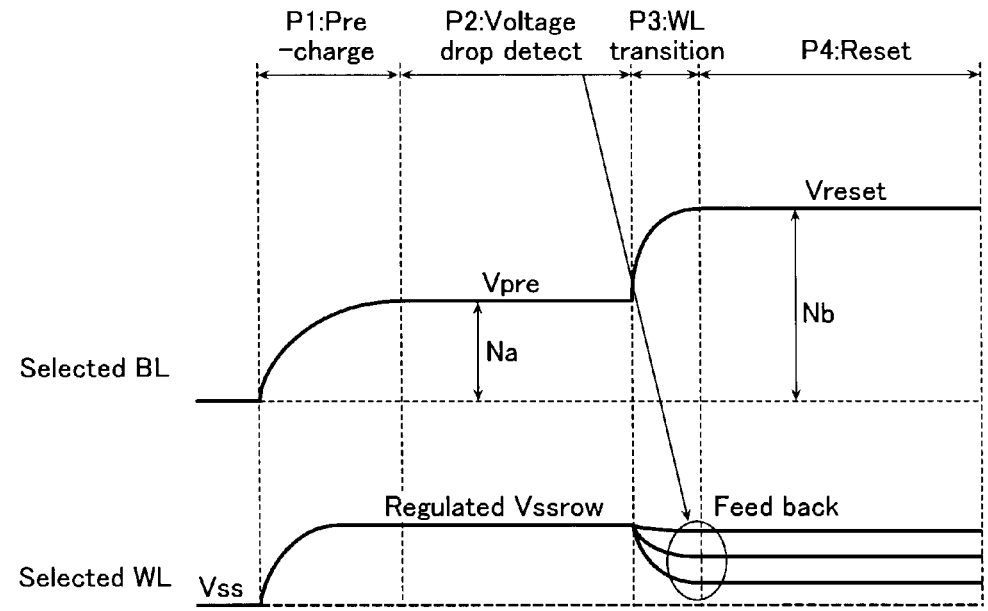
FIG. 17 shows operation waveform charts in a reset operation of the nonvolatile memory according to the second embodiment.

However, since the amount of a voltage drop ΔVwl due to a word line path varies depending on the cell current, it is fed back in consideration of the ratio between the pre-read voltage Vpre and the reset voltage Vreset (in FIG. 17, Nb/Na). Hence, in the reset operation, it is possible to obtain a reset characteristic that is not dependent on the position of the selected memory cell MC like in the read operation.

A set operation is similar to shown in FIG. 17, and explanation thereof will not be provided.

Next, a circuit configuration that realizes such set/reset/read operations will be explained.

Figure 18:
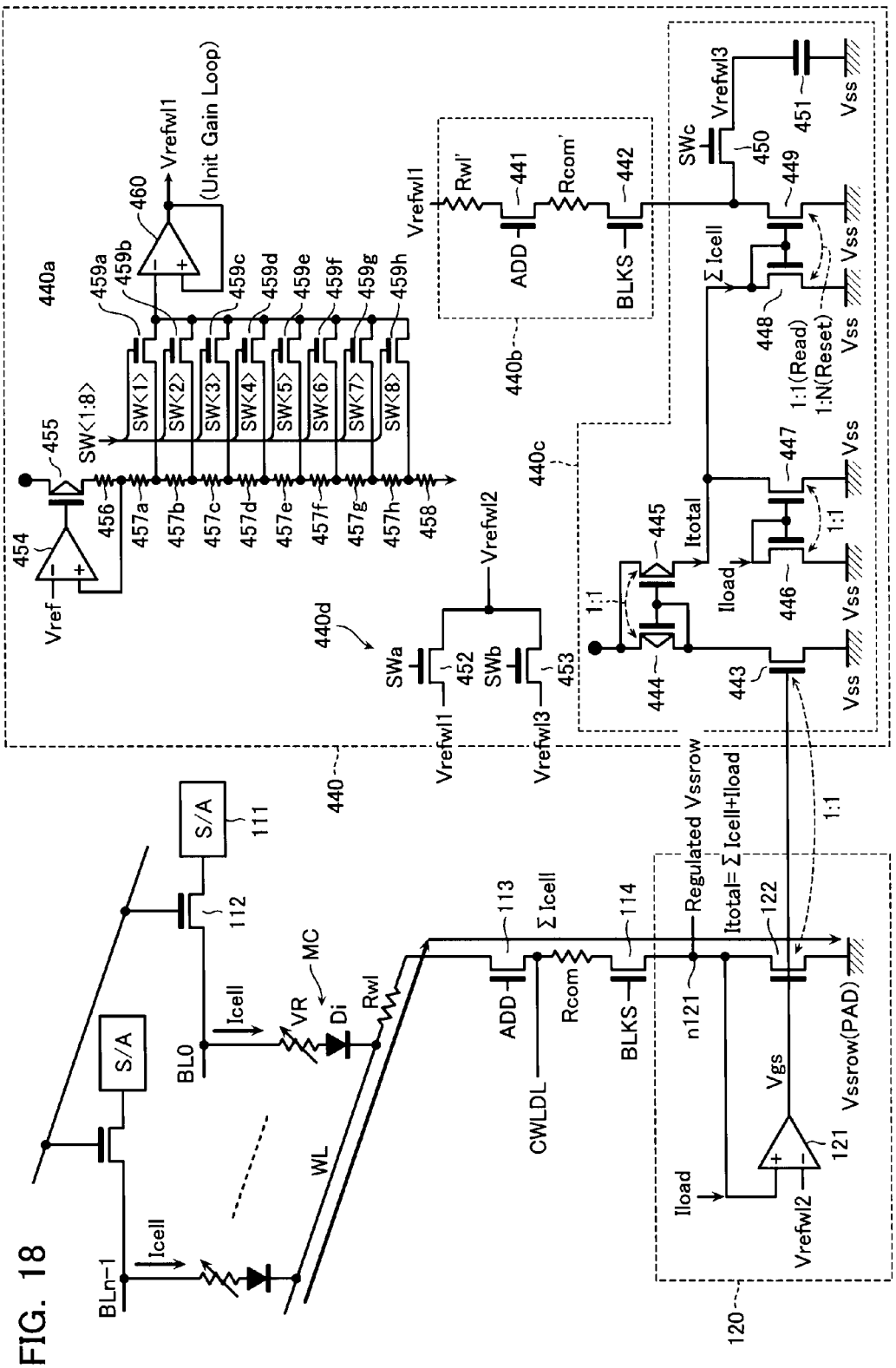
FIG. 18 is a circuit diagram showing a part of a memory cell array of a nonvolatile memory according to a third embodiment and peripheral circuits thereof.

FIG. 18 is a circuit diagram showing a part of a memory cell array of a nonvolatile memory according to the present embodiment and peripheral circuits of the memory cell array. The present nonvolatile memory is different from the nonvolatile memory according to the comparative example shown in FIG. 23 in newly including a word line voltage drop compensating circuit 440 serving as a control unit.

The word line voltage drop compensating circuit 440 includes: a first reference voltage generating circuit 440*a* configured to generate a first reference voltage Vrefwl1 serving as a reference voltage for the word line driver 120 in a pre-read operation; a word line replica circuit 440*b* having a configuration similar to a word line path and configured to replicate a voltage drop caused when a current similar to a current flowing through the word line path flows; a third reference voltage storing circuit 440*c* configured to store a third reference voltage Vrefwl3 (a second voltage) lower than the first reference voltage Vrefwl1 (a first voltage) by the amount of the voltage drop caused by the word line replica circuit 440*b*; and a second reference voltage selecting circuit 440*d* configured to select either the first reference voltage Vrefwl1 or the third reference voltage Vrefwl3 and output it as a second reference voltage Vrefwl2 (a voltage corresponding to "the word line reference voltage Vrefwl" in the first and second embodiments).

The first reference voltage generating circuit 440*a* includes: an amplifier 454 having an inverting input terminal (−) to which a certain reference voltage Vref is input; a transistor 455 controlled by the output of the amplifier 454; and resistance elements 456, 457*a*, . . . , and 457*h*, and 458 series-connected to the drain of the transistor 455. The connection point between the resistance elements 456 and 457*a* is connected to a non-inverting input terminal (+) of the amplifier 454. The amplifier 454, the transistor 455, and the resistance elements 456, 457*a*, . . . , and 457*h*, and 458 configure a voltage regulator circuit. The first reference voltage generating circuit 440*a* also includes eight transistors 459*a* to 459*h* and an amplifier 460. The transistors 459*a*, . . . , and 459*h* function as switches configured to supply the inverting input terminal (−) of the amplifier 460 with voltages occurring at the connection points between the resistance elements 457*a* and 457*b*, . . . , and the resistance elements 457*h* and 458 respectively, and are switched on/off by a switch signal SW<1:8> respectively. The amplifier 460 which receives the voltages configures a voltage follower circuit, and the output thereof is the first reference voltage Vrefwl1. This circuit 440*a* can generate the first reference voltage Vrefwl1 ranging over eight levels in accordance with the switch signal SW<1:8>, only one bit of which is activated in accordance with the position of the selected memory cell MC.

The word line replica circuit 440*b* replicates a current path between the memory cell MC and the node n121, and is a series circuit of: an interconnection line having an interconnection resistance Rwl' similar to an interconnection resistance Rwl of a word line WL; a transistor 441 having a size similar to the transistor 113 and switched on/off by an address signal ADD; an interconnection line having an interconnection resistance Rcom' similar to an interconnection resistance Rcom of the common word line; and a transistor 442 having a size similar to the transistor 114 and switched on/off by a block select signal BLKS. This circuit 440*b* has a configuration similar to the word line path.

The third reference voltage storing circuit 440*c* includes transistors 443 to 450 and a capacitor 451. The source of the transistor 443 is connected to the ground voltage Vss, and the gate thereof is connected to the output Vgs of the amplifier 121, and the transistor 443 configures a current mirror with the transistor 122 at a mirror ratio of 1:1. Hence, a total current Itotal flowing through the word line path flows through the transistor 443. The total current Itotal is a value obtained by adding the total cell current ΣIcell and a load current Iload imposed to flow into the non-inverting input terminal of the amplifier 121 of the word line driver 120. The source of the transistor 444 is connected to a power supply voltage, and the drain and gate thereof are connected to the drain of the transistor 443. The source of the transistor 445 is connected to the power supply voltage and the gate thereof is connected to the gate of the transistor 444, and the transistor 445 configures a current mirror with the transistor 444 at a mirror ratio of 1:1. Hence, the total current Itotal flows through the transistor 445. The source of the transistor 446 is connected to the ground voltage Vss, and the drain and gate thereof are connected to a constant current source of the load current Iload. The source of the transistor 447 is connected to the ground voltage Vss, the drain thereof is connected to the drain of the transistor 445, and the gate thereof is connected to the gate of the transistor 446, and the transistor 447 configures a current mirror circuit with the transistor 446 at a mirror ratio of 1:1. Hence, the load current Iload flows through the transistor 447. The source of the transistor 448 is connected to the ground voltage Vss, and the drain and gate thereof are connected to the drain of the transistor 445. A current obtained by subtracting the load current Iload flowing through the transistor 447 from the total current Itotal flowing through the transistor 445, i.e., the total cell current ΣIcell flows through the transistor 448. The source of the transistor 449 is connected to the ground voltage Vss, the drain thereof is connected to the source of the transistor 442 of the word line replica circuit 440b, and the gate thereof is connected to the gate of the transistor 448, and the transistor 449 configures a current mirror circuit with the transistor 448. Although not illustrated, a plurality of current mirror circuits each configured by the transistors 448 and 449 are provided in parallel in accordance with respective operations. The mirror ratios of these current mirror circuits are determined by the ratio between the voltage applied to the bit line BL in a pre-read operation and the voltage applied to the bit line BL in a read operation or a reset operation. Specifically, since the voltages applied to the bit line BL in a pre-read operation and in a read operation are the same, the mirror ratio of the current mirror circuit corresponding to a read operation is 1:1. On the other hand, since the voltage applied to the bit line BL in a reset operation is higher than the voltage in a pre-read operation, the mirror ratio of the current mirror circuit corresponding to a reset operation can be represented by 1:N, provided that the voltage in the reset operation is N times as high as the voltage in the pre-read operation. The capacitor 451 is connected to the connection point between the transistors 442 and 449, with the transistor 450 interposed between this connection point and the capacitor 451. The capacitor 451 stores the third reference voltage vrefwl3 obtained by subtracting the amount of a voltage drop caused by the word line replica circuit 440b from the first reference voltage Vrefwl1. The third reference voltage storing circuit 440c having the above configuration can highly accurately cause the total cell current ΣIcell to flow into the word line replica circuit 440b with the functioning of the mirror circuits. As a result, the word line replica circuit 440b can accurately track the amount of the voltage drop ΔVwl caused by the word line path.

The second reference voltage selecting circuit 440d includes two transistors 452 and 453. The transistor 452 outputs the first reference voltage Vrefwl1 as the second reference voltage Vrefwl2, and the transistor 453 outputs the third reference voltage Vrefwl3 as the second reference voltage Vrefwl2. The transistors 452 and 453 are switched on/off by switch signals SWa and SWb which are controlled such that one is activated when the other is not. That is, when the transistor 452 is switched on by the switch signal SWa, the first reference voltage Vrefwl1 is supplied to the inverting input terminal (−) of the amplifier 121 of the word line driver 121. Conversely, when the transistor 453 is switched on by the switch signal SWb, the third reference voltage Vrefwl3 is supplied thereto.

Next, an operation of the circuit shown in FIG. 18 will be explained by employing a read operation as an example.

Figure 19:
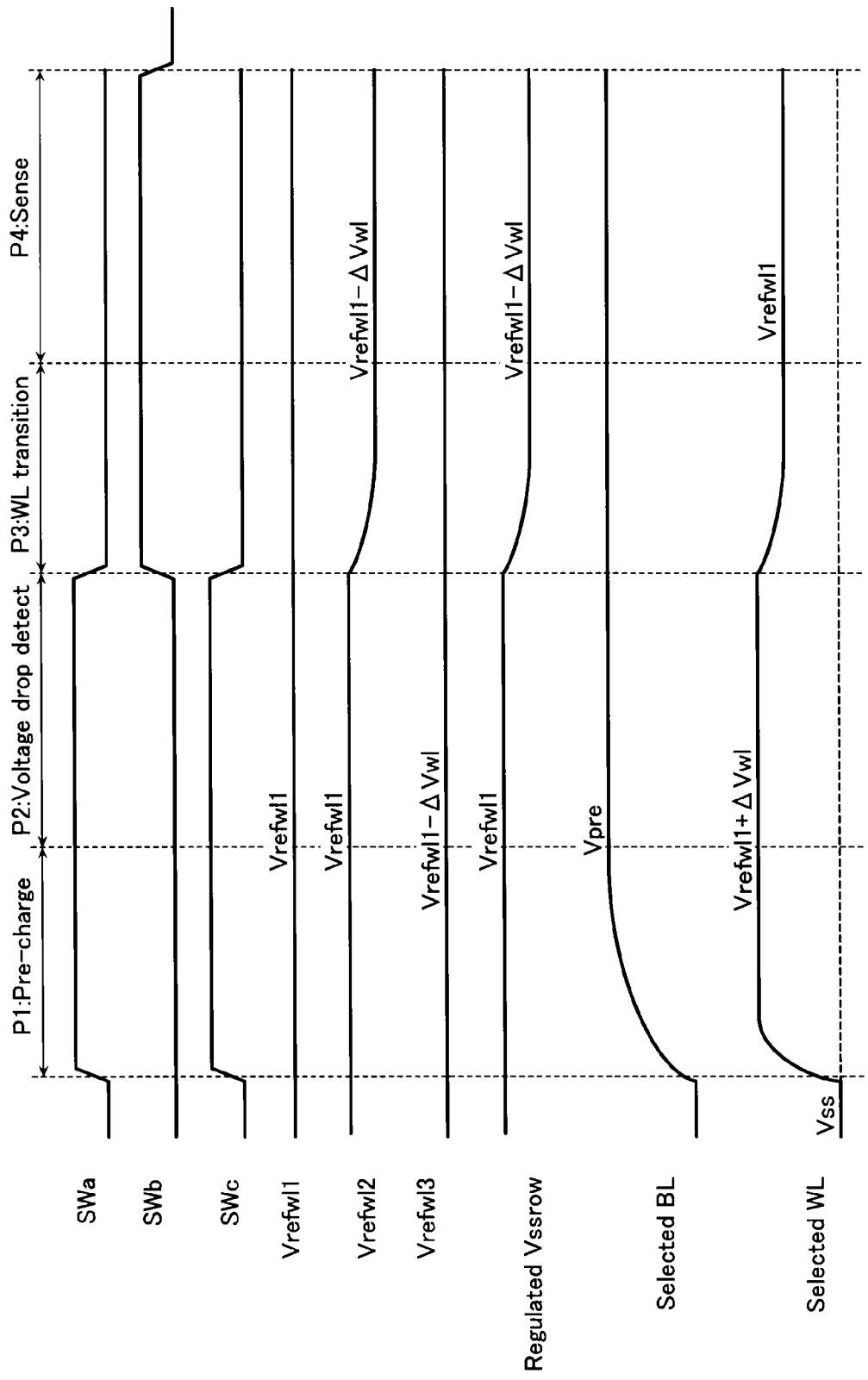
FIG. 19 shows operation waveform charts in a read operation of the nonvolatile memory according to the third embodiment.

FIG. 19 shows operation waveform charts of the respective circuits in a read operation according to the present embodiment.

First, during a period P1, the switch signal SWa is on and the switch signal SWb is off. Therefore, the first reference voltage Vrefwl1 generated by the first reference voltage generating circuit 440a is input to the inverting input (−) of the amplifier 121 of the word line driver 120. In response to this, the Regulated Vssrow of the node n121 is set to the first reference voltage Vrefwl1. As a result, the voltage of the word line WL becomes a voltage "Vrefwl1+ΔVwl" under the influence of the interconnection resistances Rwl and Rcom and the amount of the voltage drop ΔVwl of the word line path caused by the transistors 113 and 114. Meanwhile, the current mirror circuit configured by the transistors 122 and 443 to 449 causes a current ΣIcell similar to the current ΣIcell flowing through the word line WL to flow into the word line replica circuit 440b, and a voltage drop corresponding to the amount of the voltage drop ΔVwl caused by the word line path is caused by the word line replica circuit 440b. Hence, the third reference voltage Vrefwl3 becomes "Vrefwl1−ΔVwl". Since a switch signal SWc is on, the third reference voltage Vrefwl3 is applied to the capacitor 451, which hence starts to accumulate charges. The bit line BL is charged until it reaches the pre-read voltage Vpre, as described above.

A period P2 is a wait period for waiting until charges corresponding to the third reference voltage Vrefwl3 are sufficiently accumulated in the capacitor 451.

Then, during a period P3, the transistor 452 is switched off by the switch signal SWa, the transistor 453 is switched on by the switch signal SWb, and the transistor 450 is switched off by the switch signal SWc. In response to this, the charges accumulated in the capacitor 451 during the period P2 are discharged, and the voltage of the inverting input (−) of the amplifier 121 of the word line driver 120, which is the second reference voltage Vrefwl2, lowers towards the voltage "Vrefwl1−ΔVwl", which is the third reference voltage Vrefwl3. Along with this, the Regulated Vssrow of the node n121 lowers towards the voltage "Vrefwl1−ΔVwl". As a result, the voltage of the word line WL rises to the voltage Vrefwl1 higher than the voltage "Vrefwl1−ΔVwl" by the amount of the voltage drop ΔVwl.

Last, during a period P4, after the voltage of the word line WL has sufficiently risen to the first reference voltage Vrefwl1, the cell current Icell is sensed and the data is discriminated.

As described above, according to the present embodiment, it is possible to generate the same bias state in all the memory cells MC irrespective of their positions in the memory cell array 1. As a result, it is possible to improve the read margin and the reset margin, improve the accuracy of data read, and reduce occurrence of data failure. Furthermore, it is possible to speed up data input/output because the improvement in the read margin and the reset margin can increase the number of memory cells that can be accessed simultaneously.

In a reset operation and in a set operation, because the current value flowing through the word line WL when the amount of the voltage drop ΔVwl caused by the word line path is detected is different from the current value flowing in the reset operation and in the set operation, the current to flow into the word line replica circuit 440b is set similar to the reset current or the set current by changing the mirror ratio.

Fourth Embodiment

The fourth embodiment of the present invention is an applied version of the third embodiment.

In the third embodiment, a word line WL is compensated for the voltage drop caused by the word line path. Since this enables to easily execute a later-described concurrent operation, it is possible to speed up the process of a set/reset operation.

A concurrent operation applies a set/reset voltage to a plurality of memory cells MC connected to the same word line WL, and concurrently detects the currents flowing through the memory cells MC to detect the resistance state of the variable resistance elements VR of the memory cells MC.

Figure 20:
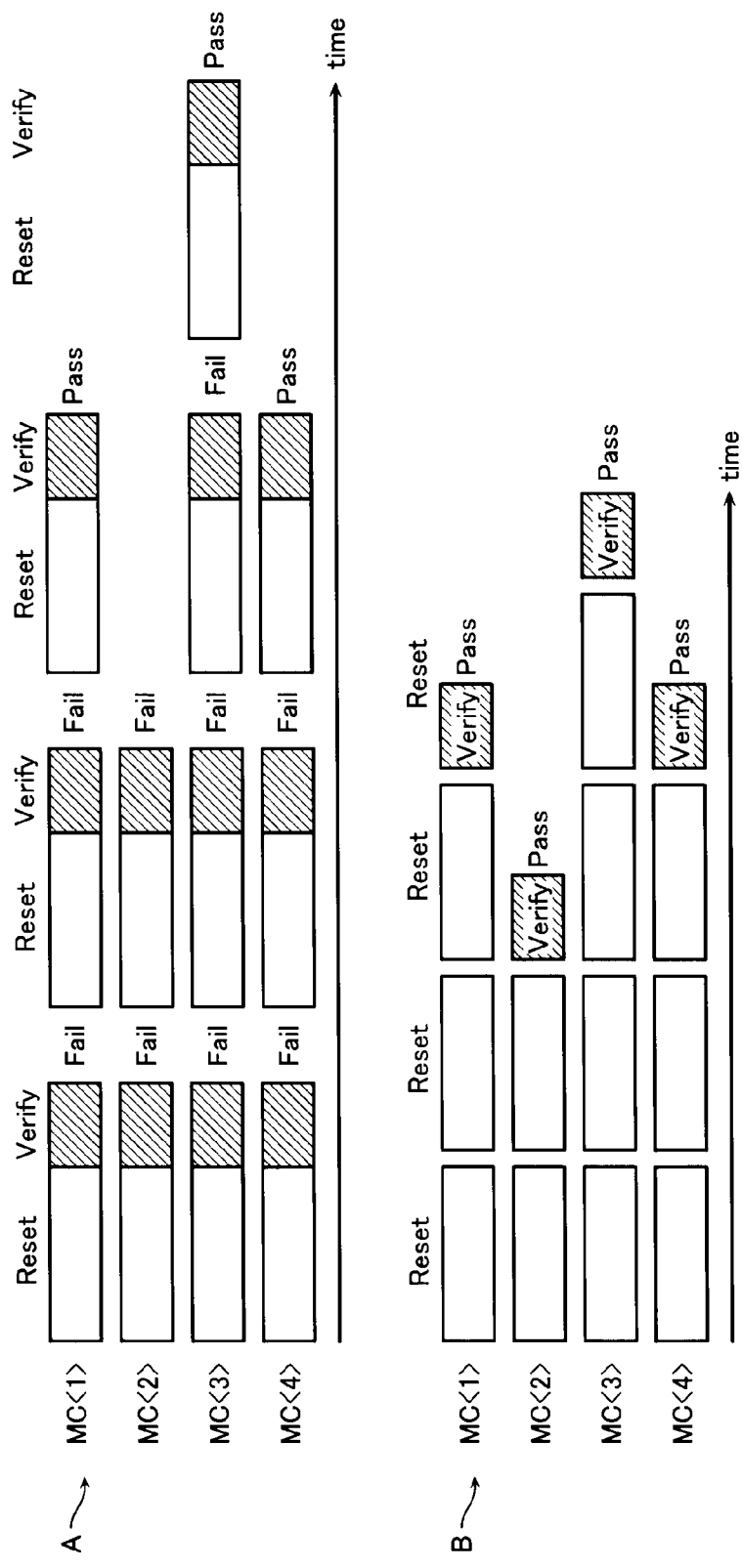
FIG. 20 is a schematic diagram explaining an operation of a nonvolatile memory according to a fourth embodiment.

Conventionally, a reset operation is realized by repeatedly executing cycles each composed of application of a reset voltage and a verify operation of confirming whether the reset is effected, until the verify operation determines a pass, as shown in FIG. 20A.

On the other hand, when executing the concurrent operation in which the resistance state of the variable resistance element VR can be detected concurrently with the application of the reset voltage, it is possible to apply the reset voltage continuously until the resistance state becomes a desired resistance state as shown in FIG. 20B. Therefore, it is unnecessary to execute the cyclic verify operations, and hence it is possible to realize the reset operation rapidly.

Figure 21:
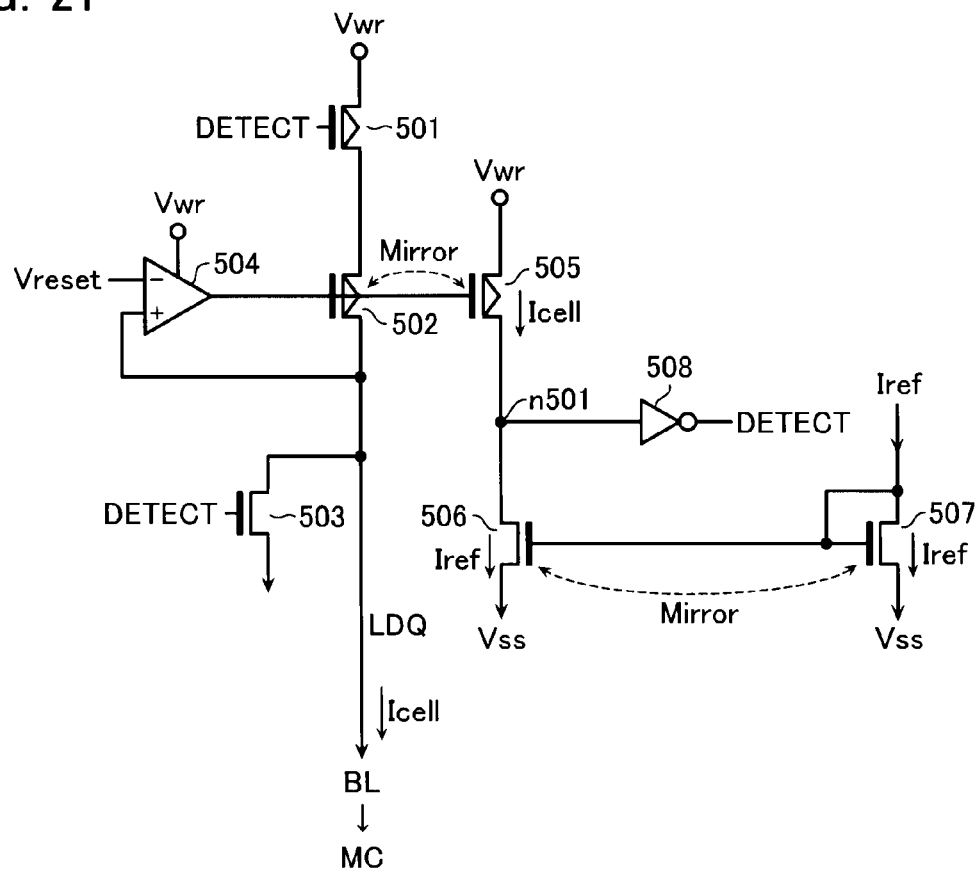
FIG. 21 is a circuit diagram of a cell current automatic detection circuit of the nonvolatile memory according to the fourth embodiment.

FIG. 21 is a circuit diagram of a cell current automatic detection circuit used for this concurrent operation. The cell current automatic detection circuit includes a PMOS transistor 501 switched on/off by a detect signal DETECT and a PMOS transistor 502 controlled by an output of an amplifier 504. The PMOS transistor 501 and the PMOS transistor 502 are provided on a local data line LDQ through which a certain writing voltage Vwr is supplied to a bit line BL. The amplifier 504 and the transistor 502 configure a voltage regulator circuit for a reset signal Vreset. The local data line LDQ is connected to a ground voltage Vss through an NMOS transistor 503 switched on/off by the detect signal DETECT.

The cell current automatic detection circuit further includes a PMOS transistor 505 and an NMOS transistor 506 which are series-connected between the writing voltage Vwr and the ground voltage Vss. Among them, the transistor 505 configures a mirror circuit with the transistor 502 at a mirror ratio of 1:1. Hence, a cell current Icell flowing through the transistor 502 also flows through the transistor 505. On the other hand, the transistor 506 configures a mirror circuit with another NMOS transistor 507 provided in the circuit at a mirror ratio of 1:1. A reference current Iref serving as a reference for the cell current Icell flowing through the memory cells MC in a reset state flows through the transistor 507. As a result, the reference current Iref flows through the transistor 506.

The cell current automatic detection circuit further includes an inverter 508 having an input terminal which is connected to the connection point between the transistors 505 and 506. The output of the inverter 508 is the detect signal DETECT.

Figure 22:
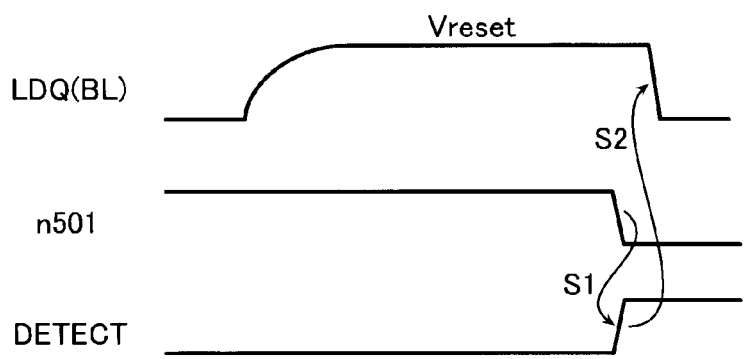
FIG. 22 shows operation waveform charts of the cell current automatic detection circuit of the nonvolatile memory according to the fourth embodiment.

Next, an operation of this circuit will be explained with reference to FIG. 22.

When the memory cells MC are not in the reset state, the detect signal DETECT is in a deactivated state, i.e., an "L" state. In this case, the transistor 501 is switched on, and hence the reset voltage Vreset is supplied to the memory cells MC through the local data line LDQ and the bit lines BL.

After this, when the variable resistance elements VR of the memory cells MC become a high resistance state, the cell current Icell decreases. The cell current continuously decreases, and when it becomes equal to or smaller than the reference current Iref, the input from the node n501 into the inverter 508 changes to "L". Therefore, the detect signal DETECT, which is the output of the inverter 508, becomes an activated state, i.e., an "H" state (step S1). As a result, the transistor 501 is switched off, and the transistor 503 is switched on. Hence, the voltage of the local data line LDQ lowers to the ground voltage Vss (step S2). Thus, the reset voltage Vreset is stopped from being supplied to the memory cells MC.

After this, in the next cycle, a verify operation is executed on the memory cells MC for which the detect signal DETECT has been activated, in order to lastly confirm whether the reset operation of the memory cells MC has been completed.

Though a reset operation has been mainly explained above, a set operation is also executed in a similar manner, and hence explanation thereof will not be provided.

As described above, it is possible to realize the concurrent operation by further using the cell current detection circuit explained in the present embodiment in addition to the word line voltage drop compensating circuit 440 shown in FIG. 18. Hence, according to the present embodiment, it is possible not only to obtain the same effect as the third embodiment, but to speed up the process of a set/reset operation.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

All of the above embodiments use unipolar memory cells configured by a variable resistance element and a diode. However, the present invention can also be applied to bipolar memory cells configured by a variable resistance element and a transistor. In this case, it is possible to obtain the same effect as the above embodiments by detecting a total cell current flowing through a source line not a word line and adjusting either the bit line clamp voltage or a reference voltage for a source line driver which corresponds to the word line driver.

What is claimed is:

1. A nonvolatile semiconductor memory device, comprising:
   a memory cell array including a plurality of first lines, a plurality of second lines intersecting the first lines, and a plurality of memory cells each including a variable resistance element disposed at an intersection of the first and second lines and configured to store an electrically rewritable resistance value as data in a nonvolatile manner; and
   a control unit configured to detect an amount of a current flowing through the first line when the plurality of memory cells connected to one of the first lines are accessed at the same time and adjust a voltage of the first or second line based on the amount of the current.

2. The nonvolatile semiconductor memory device according to claim 1,
   wherein the control unit adjusts the voltage of the first or second line based on address information of the memory cell to be accessed.

3. The nonvolatile semiconductor memory device according to claim 1, comprising
   a clamp circuit configured to control the voltage of the second line based on a control signal sent by the control unit.

4. The nonvolatile semiconductor memory device according to claim 1, comprising
   a voltage regulator circuit configured to adjust the voltage of the first line to a certain level based on a control signal sent by the control unit.

5. The nonvolatile semiconductor memory device according to claim 3,
   wherein the control unit includes:
   an analog-digital converter configured to detect the amount of the current flowing through the first line, generate digital data based on the amount of the current, and output the digital data; and a control signal generator configured to generate the control signal based on the digital data and address information and output the control signal.

6. The nonvolatile semiconductor memory device according to claim 4,
wherein the control unit includes:
an analog-digital converter configured to detect the amount of the current flowing through the first line, generate digital data based on the amount of the current, and output the digital data; and
a control signal generator configured to generate the control signal based on the digital data and address information and output the control signal.

7. The nonvolatile semiconductor memory device according to claim 2, comprising
a driver circuit configured to supply the first line with a voltage necessary for accessing the memory cell,
wherein addresses of the memory cells are assigned based on a distance between the memory cells and the driver circuit.

8. The nonvolatile semiconductor memory device according to claim 3, comprising
a driver circuit configured to supply the first line with a voltage necessary for accessing the memory cell,
wherein the longer a distance between the memory cell to be accessed and the driver circuit is, the wider the control unit makes an adjustment range of the clamp circuit.

9. A nonvolatile semiconductor memory device, comprising:
a memory cell array including a plurality of first lines, a plurality of second lines intersecting the first lines, and a plurality of memory cells each including a variable resistance element disposed at an intersection of the first and second lines and configured to store an electrically rewritable resistance value as data in a nonvolatile manner; and
a control unit configured to detect an amount of a current flowing through the first line when the memory cell is accessed and adjust a voltage of the first or second line based on the amount of the current and a position of the memory cell accessed.

10. The nonvolatile semiconductor memory device according to claim 9, comprising
a clamp circuit configured to limit the voltage of the second line based on a control signal sent by the control unit.

11. The nonvolatile semiconductor memory device according to claim 9, comprising
a voltage regulator circuit configured to adjust the voltage of the first line to a certain level based on a control signal sent by the control unit.

12. The nonvolatile semiconductor memory device according to claim 10, comprising
a driver circuit configured to supply the first line with a voltage necessary for accessing the memory cell,
wherein the longer a distance between the memory cell to be accessed and the driver circuit is, the wider the control unit makes an adjustment range of the clamp circuit.

13. A nonvolatile semiconductor memory device, comprising:
a memory cell array including a plurality of first lines, a plurality of second lines intersecting the first lines, and a plurality of memory cells each including a variable resistance element disposed at an intersection of the first and second lines and configured to store an electrically rewritable resistance value as data in a nonvolatile manner;

a control unit configured to detect an amount of a current flowing through the first line when the memory cell is accessed and adjust a voltage of the first or second line based on the amount of the current; and
a voltage regulator circuit configured to adjust the voltage of the first line to a certain level based on a control signal sent by the control unit,
wherein the control unit includes a replica circuit having a configuration similar to an interconnection line path between the first line and the voltage regulator circuit, causes a current corresponding to the current flowing through the first line to flow through the replica circuit, and controls the voltage regulator circuit based on a voltage drop caused by the replica circuit.

14. The nonvolatile semiconductor memory device according to claim 13,
wherein the control unit includes a memory circuit configured to store a second voltage obtained by subtracting the voltage drop caused by the replica circuit from a certain first voltage, sets a desired voltage to be applied to the first line in a read/set/reset operation to the first voltage before the read/set/reset operation, and stores the second voltage in the memory circuit, and
in the read/set/reset operation, the voltage regulator circuit adjusts the voltage of the first line based on the second voltage stored in the memory circuit.

15. The nonvolatile semiconductor memory device according to claim 13,
wherein the control circuit includes a mirror circuit configured to cause the current corresponding to the current flowing through the first line to flow into the replica circuit, and
the mirror circuit switches its mirror ratio in accordance with each of read, set, and reset operations.

16. The nonvolatile semiconductor memory device according to claim 13,
wherein the control unit includes a voltage generating circuit configured to adjust the first voltage in accordance with an address of the memory cell to be accessed.

17. The nonvolatile semiconductor memory device according to claim 13, comprising
a cell current detection circuit configured to detect a current of the second line in a set/reset operation, and determine whether or not the memory cell connected to the second line has shifted to a set/reset state.

18. The nonvolatile semiconductor memory device according to claim 17,
wherein the cell current detection circuit stops the set/reset operation of the memory cell, upon detecting that the memory cell has shifted to the set/reset state.

19. The nonvolatile semiconductor memory device according to claim 17, comprising
a voltage supplying circuit configured to supply a voltage necessary for each of set and reset operations to ones of a plurality of memory cells connected to one of the first lines, and concurrently supply a voltage necessary for a verify operation to the remaining memory cells detected by the cell current detection circuit as having shifted to the set/reset state.

20. The nonvolatile semiconductor memory device according to claim 13,
wherein the control unit adjusts the voltage of the first or second line based on a position of the memory cell to be accessed.

* * * * *